US012451325B2

(12) United States Patent
Dech

(10) Patent No.: US 12,451,325 B2
(45) Date of Patent: Oct. 21, 2025

(54) CHARGED PARTICLE BEAM AXIAL CALIBRATION

(71) Applicant: Multibeam Corporation, Santa Clara, CA (US)

(72) Inventor: Jeffery Michael Dech, Santa Clara, CA (US)

(73) Assignee: Multibeam Corporation, Santa Clara, CA (US)

( * ) Notice: Subject to any disclaimer, the term of this patent is extended or adjusted under 35 U.S.C. 154(b) by 466 days.

(21) Appl. No.: 17/897,117

(22) Filed: Aug. 26, 2022

(65) Prior Publication Data

US 2024/0404783 A1 Dec. 5, 2024

Related U.S. Application Data

(60) Provisional application No. 63/237,671, filed on Aug. 27, 2021.

(51) Int. Cl.
*H01J 37/21* (2006.01)
*H01J 37/22* (2006.01)

(52) U.S. Cl.
CPC ............ *H01J 37/21* (2013.01); *H01J 37/222* (2013.01); *H01J 2237/216* (2013.01)

(58) Field of Classification Search
CPC .. H01J 37/00; H01J 37/02; H01J 37/21; H01J 37/222; H01J 37/26; H01J 37/28; H01J 2237/216; H01J 2237/2826
USPC .................. 250/492.1, 492.2, 306, 307, 311
See application file for complete search history.

(56) References Cited

U.S. PATENT DOCUMENTS

| | | | | |
|---|---|---|---|---|
| 6,590,209 B1 * | 7/2003 | Bajt | G01R 33/10 | 250/311 |
| 2003/0006371 A1 * | 1/2003 | Watanabe | H01J 37/28 | 250/307 |
| 2009/0078869 A1 * | 3/2009 | Matsumoto | H01J 37/26 | 250/311 |
| 2013/0320210 A1 * | 12/2013 | Yamada | H01J 37/1471 | 250/307 |

* cited by examiner

*Primary Examiner* — Jason L McCormack
(74) *Attorney, Agent, or Firm* — Seth A. Horwitz; Carrington, Coleman, Sloman & Blumenthal, LLP

(57) ABSTRACT

In described examples, a method of operating a charged particle beam tool including a charged particle beam column configured to generate a charged particle beam includes capturing an under-focused image of a calibration target using the beam and capturing an over-focused image of the target using the beam. After determining an offset vector between the under-focused and over-focused images, if a magnitude of the offset vector is greater than a threshold, a charge distribution of the alignment electrodes is adjusted so that the charged particle beam has an adjusted alignment. The adjustment is made in response to the offset vector, to reduce a disalignment of the beam from an optical axis of the column. The method is then repeated using the adjusted alignment. If the magnitude of the offset vector is less than the threshold, the substrate is processed using the adjusted alignment.

21 Claims, 14 Drawing Sheets

CHARGED PARTICLE BEAM AXIAL CALIBRATION

CROSS-REFERENCE

This application is a non-provisional of, and claims priority to, U.S. Provisional Patent Application No. 63/237,671, filed Aug. 27, 2021, which is incorporated herein by reference.

ACKNOWLEDGMENT OF GOVERNMENT SUPPORT

This invention was made with Government support under contract FA9453-17-C-0015 awarded by the Air Force Research Laboratory. The Government has certain rights in the invention.

TECHNICAL FIELD

The present application relates to charged particle beam tool configuration and control, and more particularly to charged particle beam column calibration.

BACKGROUND

Various methods and technologies can be employed for shaping charged particle beams to achieve a desired charge distribution and shape of a charged particle beam within a target frame. Electron beam writing and imaging systems, for example, typically comprise an electron beam column and a target substrate to deposit electrons on, or a target sample to image. The electron beam column generally comprises an electron source, which emits electrons that are collimated and accelerated along the length of the column. The electron beam column also includes one or more electrostatic or magnetostatic deflectors, as well as one or more focusing lenses that aim the beam at the targeted area. The deflectors are generally responsible for changing the location of the beam within the column and its intersection point with the wafer. The focusing lenses generally serve the purpose of changing the shape of the beam.

In imaging applications, a detector is used to measure electrons scattered from the target (backscattered electrons), and/or emitted from the target (secondary electrons), into the active area of the detector. Detectors for charged particle beam imaging can include, for example, photodiodes or scintillator crystals.

SUMMARY

In described examples, a method of operating a charged particle beam tool including a charged particle beam column configured to generate a charged particle beam includes capturing an under-focused image of a calibration target using the beam and capturing an over-focused image of the target using the beam. After determining an offset vector between the under-focused and over-focused images, if a magnitude of the offset vector is greater than a threshold, a charge distribution of the alignment electrodes is adjusted so that the charged particle beam has an adjusted alignment. The adjustment is made in response to the offset vector, to reduce a disalignment of the beam from an optical axis of the column. The method is then repeated using the adjusted alignment. If the magnitude of the offset vector is less than the threshold, the substrate is processed using the adjusted alignment.

BRIEF DESCRIPTION OF THE DRAWINGS

The disclosed inventive scope will be described with reference to the accompanying drawings, which show important sample embodiments and which are incorporated in the specification hereof by reference, wherein.

Some components in later figures are similar to those in earlier figures, and are given the same item numbering to indicate similarity.

DETAILED DESCRIPTION OF SAMPLE EMBODIMENTS

The numerous innovative teachings of the present application will be described with particular reference to presently preferred embodiments (by way of example, and not of limitation). The present application broadly describes inventive scope, and none of the statements below should be taken as limiting the claims generally.

Methods and systems are disclosed for automatically reducing or minimizing deviation of a charged particle beam from a center-line of an axis along which the beam is projected. In some examples, such methods and systems include an in-column deflector system, a charged particle imaging sensor, a stage system for moving a workpiece 110 that includes a calibration target 604 on the workpiece surface 204, and integrated control. In some examples, disclosed systems and methods enable avoidance of operator intervention in analyzing image capture data and performing calibration adjustments.

Some exemplary parameters will be given to illustrate the relations between these and other parameters. However, it will be understood by a person of ordinary skill in the art that these values are merely illustrative, and will be modified by scaling of further device generations, and will be further modified to adapt to different materials or architectures if used.

Embodiments disclosed herein use one or more charged particle beam columns to image a calibration target. Preferred embodiments use arrays of electrostatically controlled electron beam (e-beam) mini-columns. In some examples, mini-columns can range in size from one inch to twelve inches in height. In some examples, mini-column beam energies can range from one kV (kilovolt) to fifty kV. In some examples, beam processing, including imaging, writing, and modification (as further described with respect to FIG. 1B) are performed at constant beam energy. In some examples, if beam energy is changed, alignment as described below with respect to, for examples, FIGS. 4A through 10, is re-performed.

Example control and shaping of charged particle beams is disclosed in U.S. Pat. No. 8,242,457, which is incorporated herein by reference. Example targets that may be used in calibration as disclosed herein are disclosed in U.S. Pat. Nos. 9,478,395 and 9,595,419, each and all of which are incorporated herein by reference.

A "substrate" is a workpiece having a composition and shape amenable to imaging, patterning, and/or modification of one or more layers of material thereupon using techniques applicable to semiconductor device fabrication.

A "computer vision analysis" determines physical properties based on features within one or more images.

Figure 1A:
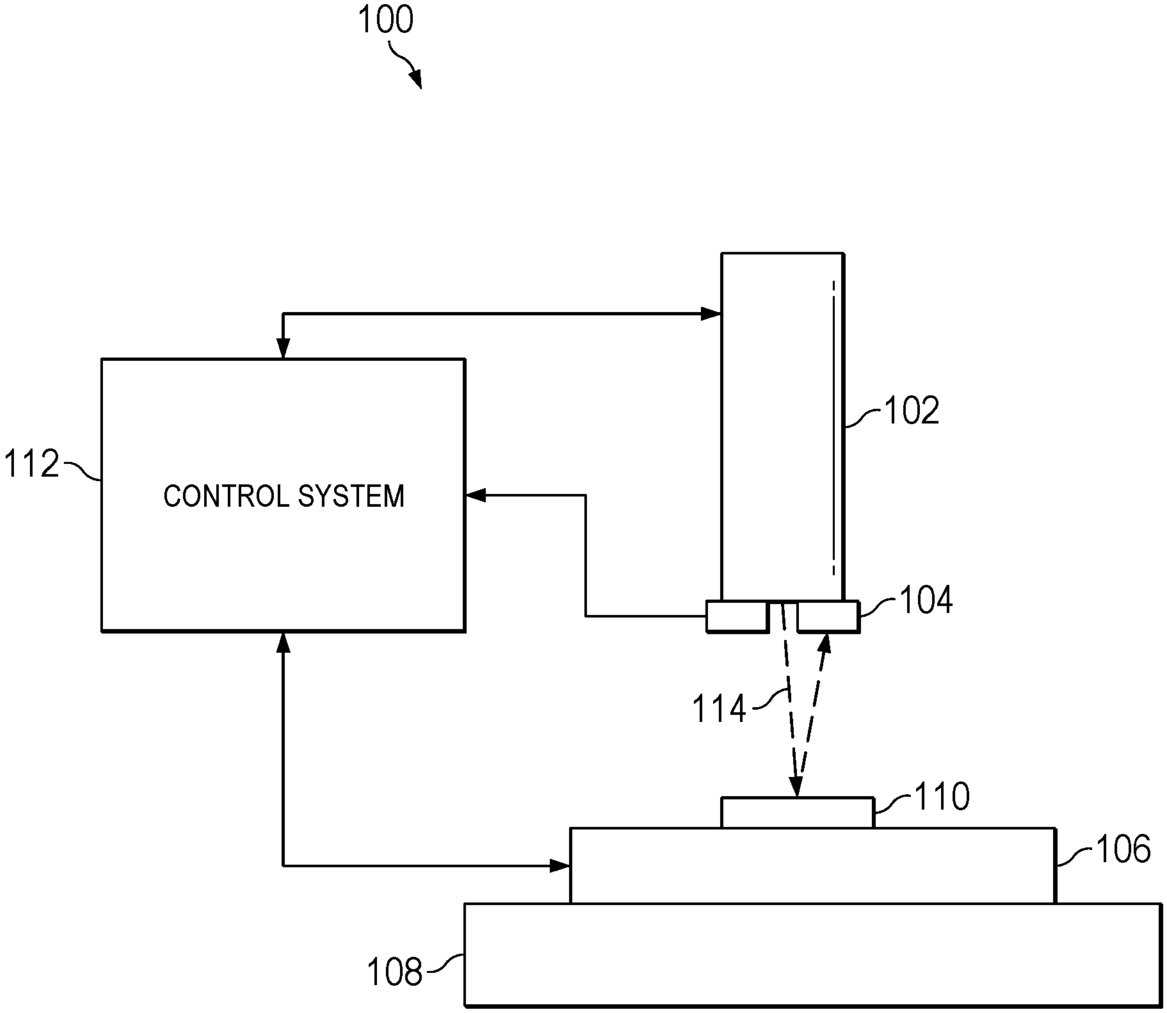
FIG. 1A shows an example of a charged particle beam tool.

FIG. 1A shows an example of a charged particle beam tool 100. The charged particle beam tool 100 includes a charged particle beam column 102, a charged particle beam detector 104, a chuck 106, a substrate positioning system 108, a workpiece 110, and a control system 112. The charged particle beam column 102 can be an electron beam column or an ion beam column. The charged particle beam column 102 projects a charged particle beam 114 towards the surface 204 (see FIG. 2) of the workpiece 110. In some examples, the charged particle beam 114 can be backscattered from the surface 204 (see FIG. 1B) of the workpiece 110, or cause the workpiece surface 204 to emit secondary electrons. Secondary electrons are generated as ionization products. The charged particle beam detector 104 correspondingly backscattered or secondary electrons or ions.

The control system 112 uses data corresponding to the detected charged particles to image features on the surface 204 of the workpiece 110, or to determine other or additional properties of the surface 204 or near-surface regions of the workpiece 110. For example, detected charged particle data can be used to perform critical dimension and overlay metrology, and to perform localized process monitoring. The control system 112 controls the charged particle beam column 102 and the substrate positioning system 108 in response to the detected charged particle data. For example, the control system 112 controls the charged particle beam tool 100 to perform beam calibration as described with respect to FIGS. 4A to 10. The charged particle beam column 102 remains physically stationary while deflecting the charged particle beam 114 across the workpiece surface 204 under control of the control system 112.

The chuck 106 is attached to the substrate positioning system 108 so that the chuck 106 is maintained in a fixed position relative to the substrate positioning system 108. The workpiece 110 is attached to the chuck 106 so that the workpiece 110 is maintained in a fixed position relative to the chuck 106. That is, the chuck 106 clamps the workpiece 110 onto the substrate positioning system 108. The chuck 106 pulls the workpiece 110 flat and holds it steady during processing of the workpiece 110 by the charged particle beam tool 100. The stage 108, or wafer stage 108, refers to the substrate positioning system 108.

The substrate positioning system 108 is configured to move precisely with, for example, six degrees of freedom. In some examples, a substrate positioning system 108 can have between two and six degrees of freedom. In some examples, the substrate positioning system 108 is accurate to within between 100 nm and 2 micrometers. In some examples, the substrate positioning system 108 is accurate to within less than 100 nm. In some examples, a precise measurement system, such as with an accuracy to within less than 5 nm, can be used to enable deflection of the charged particle beam 114 to correct for positioning errors. In some examples, a charged particle beam 114 can have resolution between 1 and 1,000 nm. In some examples, a frame is between 0.5 and 1000 microns in length and width (length and width can be different). Accordingly, the fixed relative position of the workpiece 110 with respect to the substrate positioning system 108 enables the workpiece 110 to be moved with the same precision. Herein, the "same" and "approximately" mean within manufacturing and design tolerances.

Figure 1B:
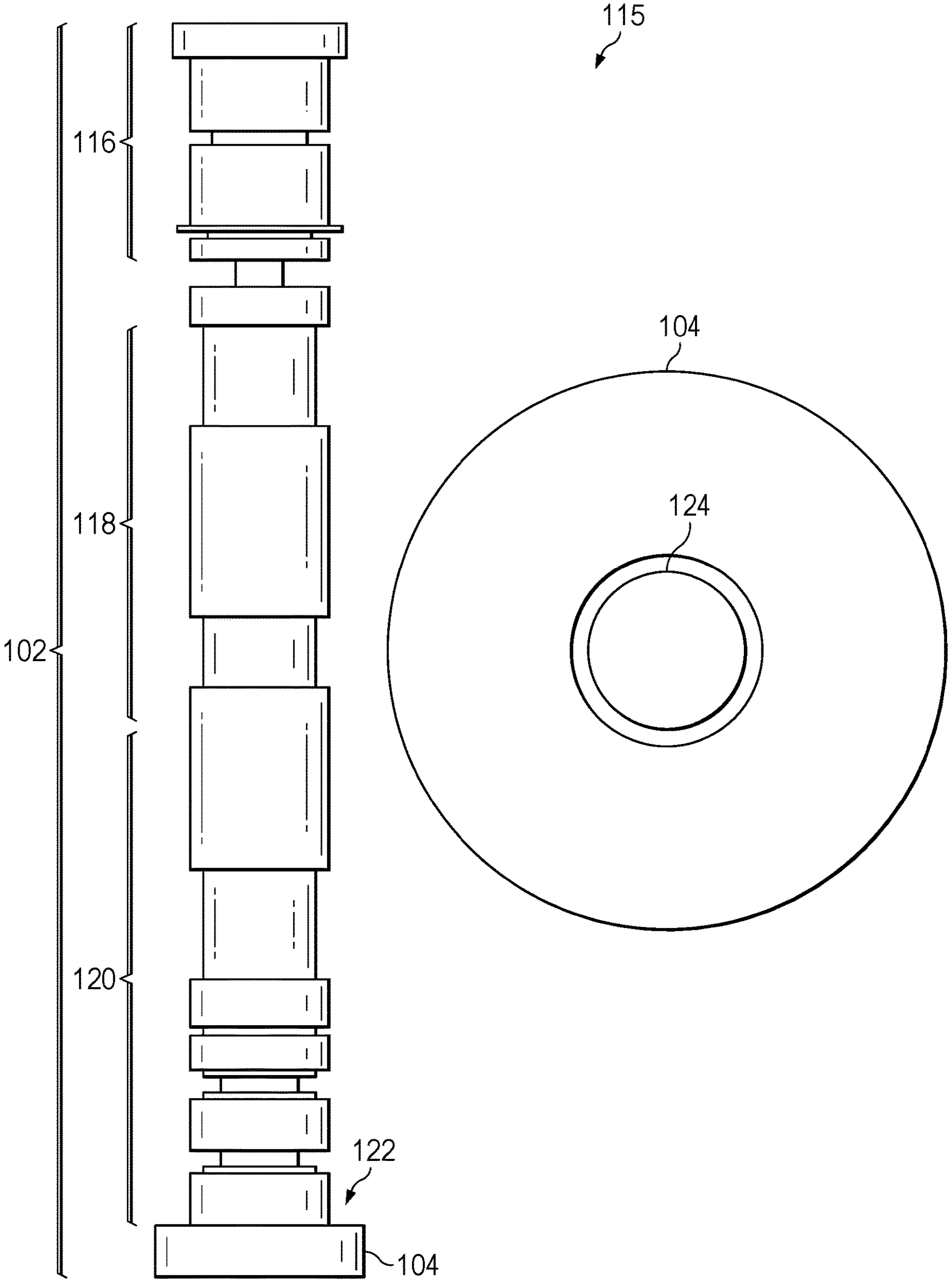
FIG. 1B shows an example view of the charged particle beam column and the charged particle beam detector.
Figure 1C:
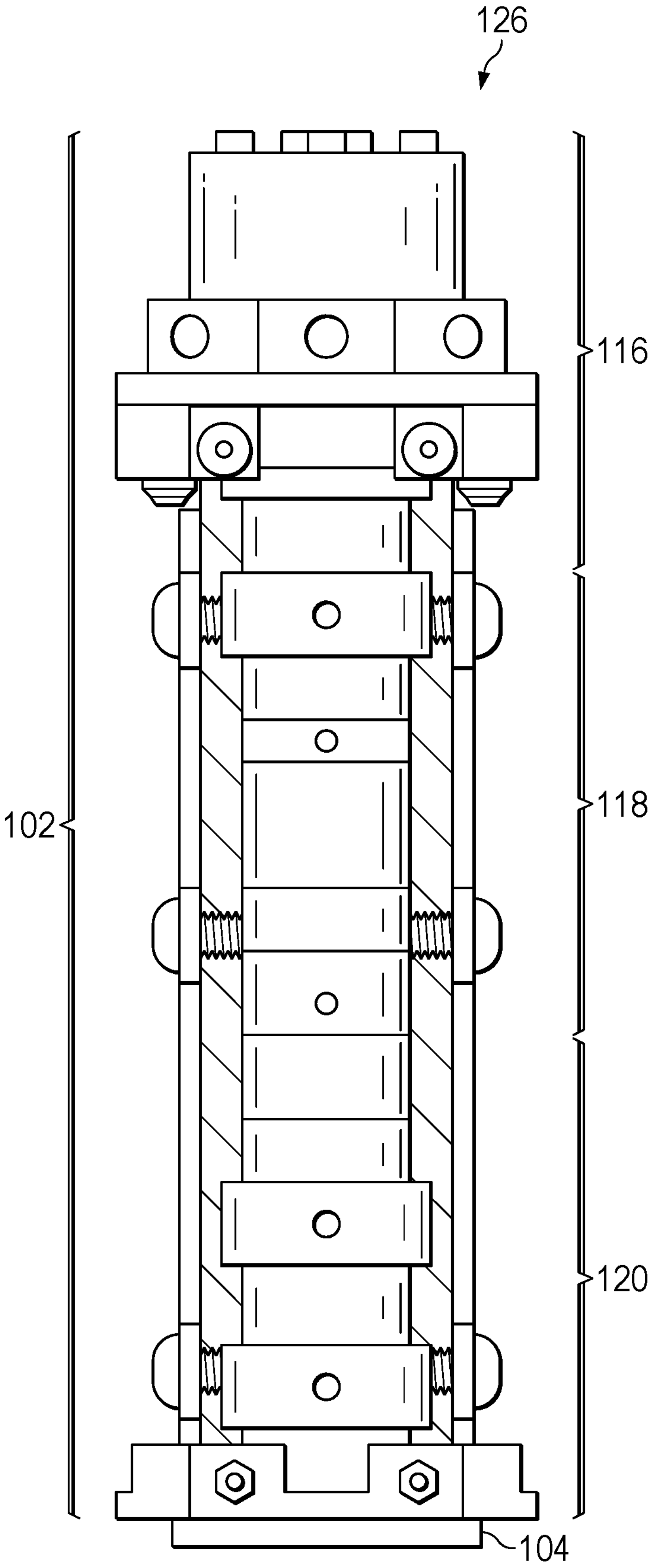
FIG. 1C shows another view of the charged particle beam column and the charged particle beam detector.

FIG. 1B shows an example view 115 of the charged particle beam column 102 and the charged particle beam detector 104. The charged particle beam column 102 includes a charged particle beam gun section 116, a beam control assembly 118, and a main lens 120. The charged particle beam gun section 102 includes a charged particle beam gun with a charged particle source, a limiting aperture, and an electrostatic lens. The charged particle beam gun can be an ion gun including an ion source, or an electron gun including an electron source. The beam control assembly 118 includes structure for blanking the charged particle beam 114, deflecting a trajectory of the charged particle beam 114 by applying a force vector 504 (see FIG. 5), or modifying the shape of the charged particle beam 114. Modifying the shape of the charged particle beam 114 is also referred to as reshaping the charged particle beam 114. The main lens 120 is used to focus the charged particle beam 114—accordingly, to adjust a cross-sectional area, or spot size, of the charged particle beam 114 where it intersects the surface 204 of the workpiece 110. The surface 204 of the workpiece 110 is also referred to as the substrate plane. The charged particle beam detector 104 includes an aperture 122 through which the charged particle beam 114 passes. In some examples, the charged particle beam detector 104 has an annular shape. FIG. 1C shows another view 126 of the charged particle beam column 102 and the charged particle beam detector 104.

Figure 1D:
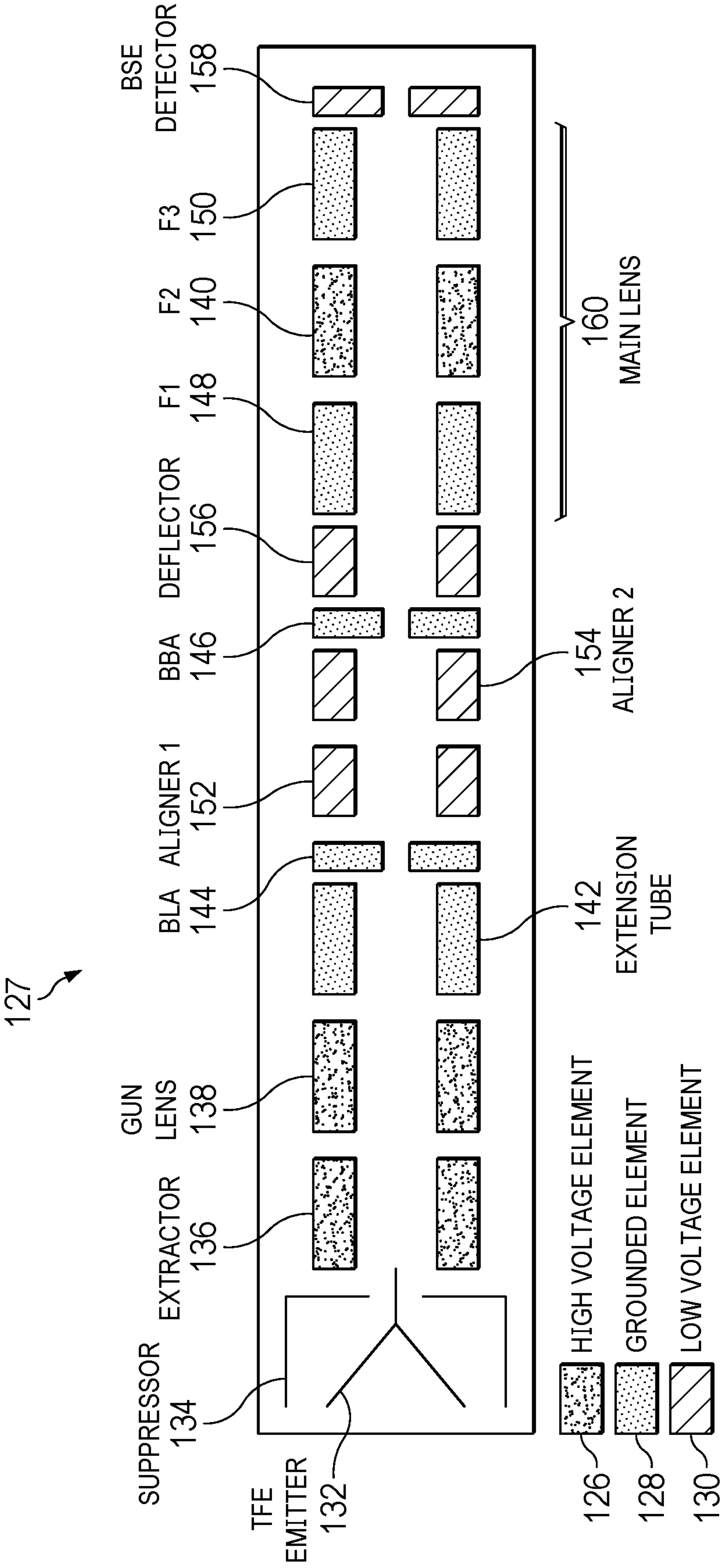
FIG. 1D shows a functional block diagram of the charged particle beam column and the charged particle beam detector.

FIG. 1D shows a functional block diagram 127 of the charged particle beam column 102 and the charged particle beam detector 104. The charged particle beam column 102 includes high voltage elements 126, grounded elements 128, and low voltage elements 130. The high voltage elements 126 include a thermal field emitter (TFE emitter) 132, a suppressor 134, an extractor 136, a gun lens 138, and F2 140. The grounded elements 128 include an extension tube 142, a beam limiting aperture (BLA) 144, a beam blanking aperture (BBA) 146, F1 148, and F3 150. The low voltage elements 130 include a first aligner (aligner 1) 152, a second aligner (aligner 2) 154, a deflector 156, and a backscattered electron (BSE) detector 158. The BSE detector 158 is a type of charged particle detector 104.

The TFE emitter 132, also called a Schottky emitter, emits electrons in response to an applied voltage. (In some examples, other types of charged particle emitters may be used.) The suppressor 134 prevents unwanted electron emission from the sides of the TFE emitter 132. The extractor 136 is at a large positive voltage with respect to the TFE emitter 132, effectively pulling electrons out of the TFE emitter 132. Adjusting voltage of the extractor 136 adjusts electron emission of the TFE emitter 132. The voltage gradient between the gun lens element 138 and the extension tube 142 acts as a lens. Accordingly, the gun lens element 138, together with the extractor 136 and the extension tube 142, comprise a lens system that is used to perform a rough collimation of the charged particle beam 114, i.e., an initial focusing of the emitted electrons into a beam.

The beam limiting aperture 144 is sized and located to block unwanted portions of the roughly collimated charged particle beam 114. The beam blanking aperture 146 is a shutter for the charged particle beam 114, allowing the charged particle beam column 102 to stop and start emitting the charged particle beam 114 without having to turn the charged particle beam column 102 off and on. The deflector 156 deflects the charged particle beam 114 within the main-field deflection area (the frame, see FIGS. 3A and 3B), i.e., to target selected locations on the workpiece surface 204. The first aligner 152 and second aligner 154 are alignment electrodes 406 (see FIG. 4), together forming a double-deflection aligner 418 that includes first alignment electrodes 418*a* and second alignment electrodes 418*b*. The first and second alignment electrodes 418*a* and 418*b* are separately chargeable and perform separate deflections of the charged particle beam 114. The alignment electrodes 406 align the charged particle beam 114 to an optical axis 410 of the charged particle beam column 102. The optical axis 410 is similar to and may be approximated by a central axis (or a center line from the TFE emitter 132 to a center of the aperture 124) of the charged particle beam column 102. The optical axis 410 is further described with respect to FIG. 4.

F1 140, F2 148, and F3 150 are focusing elements that together comprise the main lens 160. The main lens 160 is, for example, an Einzel lens. The control system 112 controls the voltage on F2 148 to control focus of the charged particle beam 114. Focus of the charged particle beam 114 is further described with respect to FIG. 8.

Figure 2:
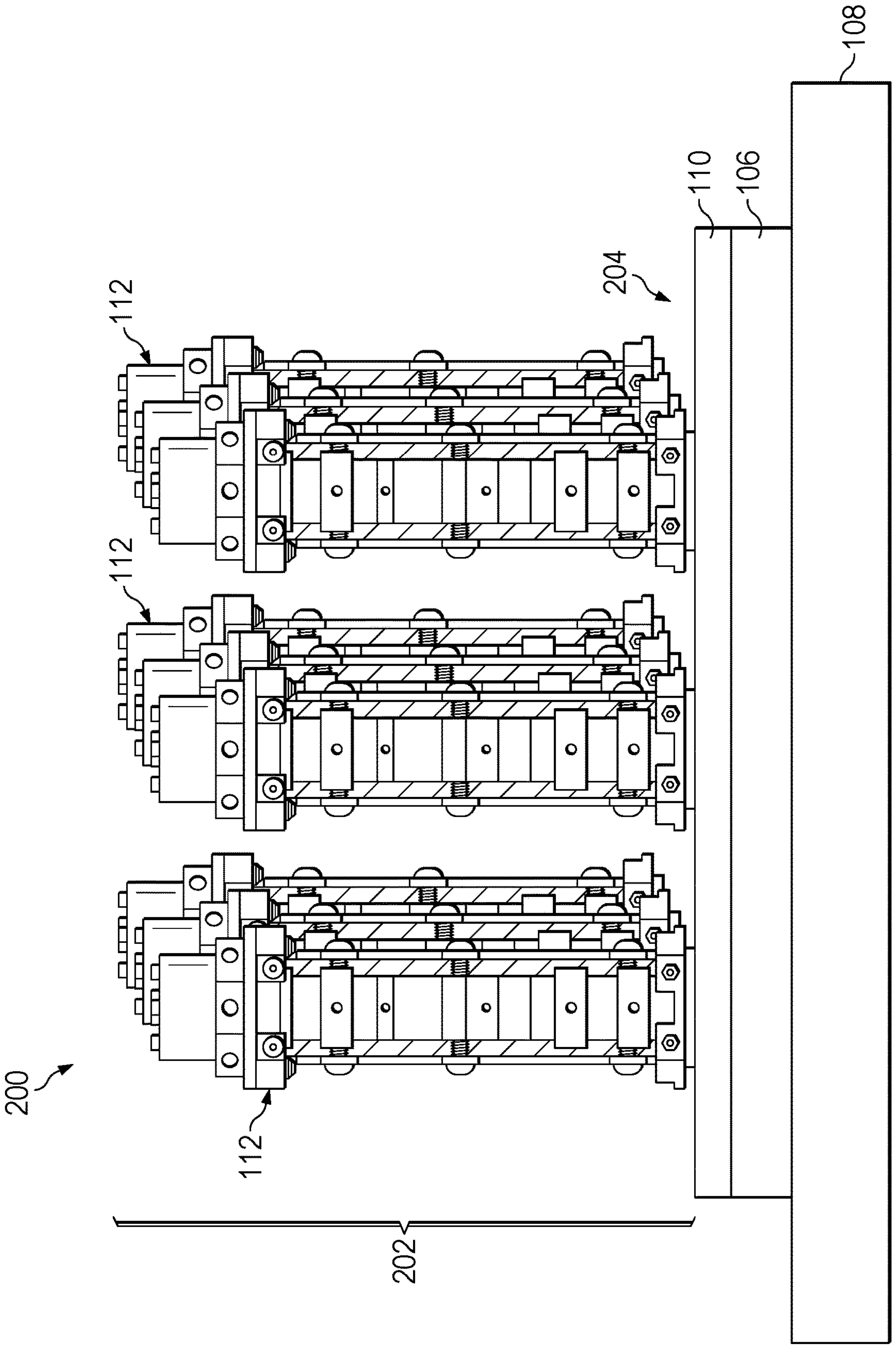
FIG. 2 illustrates an example workpiece processing system.

FIG. 2 illustrates an example workpiece processing system 200. The workpiece processing system 200 includes an array 202 of multiple charged particle beam columns 102 (for example, multiple rows of multiple columns of charged particle beam columns 102), a workpiece 110, a chuck 106, and a substrate positioning system 108. Charged particle beam columns 102 of the array 202 are aligned into evenly spaced, orthogonal rows and columns. Accordingly, the array 202 includes miniature charged particle beam columns 206 arranged in a regular grid. Here, miniature means small enough to fit multiple charged particle beam columns 102 in the array 202. Columns of the array 102 can project charged particle beams 114 to process the surface 204 of the workpiece 110.

Figure 3A:
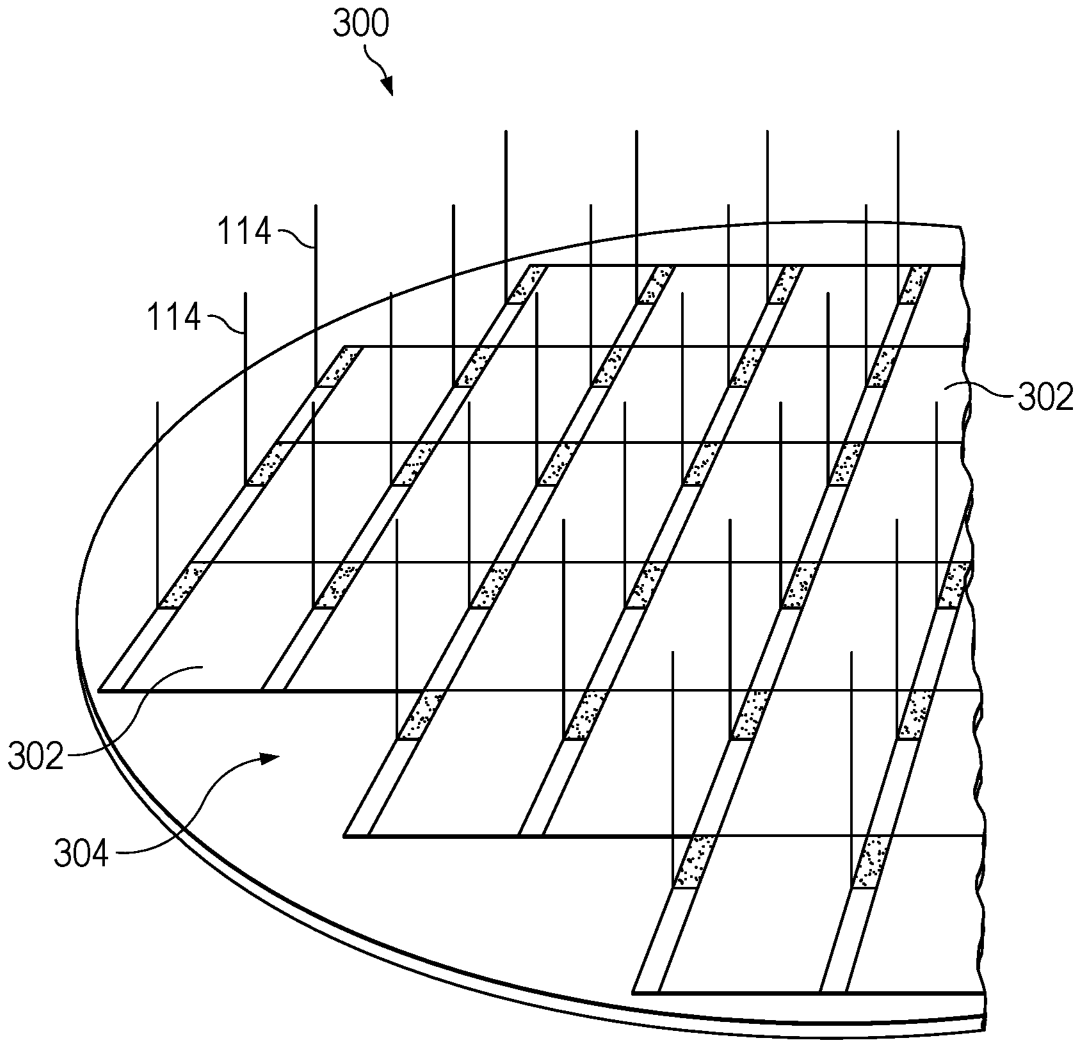
FIG. 3A shows an example of a semiconductor wafer being scanned by multiple charged particle beams emitted by respective miniature electrostatically-deflected charged particle beam columns.

FIG. 3A shows an example of a semiconductor wafer 300 being scanned by multiple charged particle beams 114 emitted by respective miniature electrostatically-deflected charged particle beam columns 102. A semiconductor wafer 300 is an example of a workpiece 110. Individual charged particle columns 102 are able to target a corresponding writing area 302. A writing area 302 is a portion of the substrate surface 304 that charged particle beam columns 102 in a beam column array 202 can reach with their respectively emitted charged particle beams 114 as the workpiece 110 is moved by the substrate positioning system 108 and the charged particle beams 114 are deflected. Accordingly, the writing area 302 of a charged particle beam column 102 is the portion of the substrate surface 304 targetable by the charged particle beam 114 emitted from the charged particle beam column 102, taking into account movement of the stage 108.

Figure 3B:
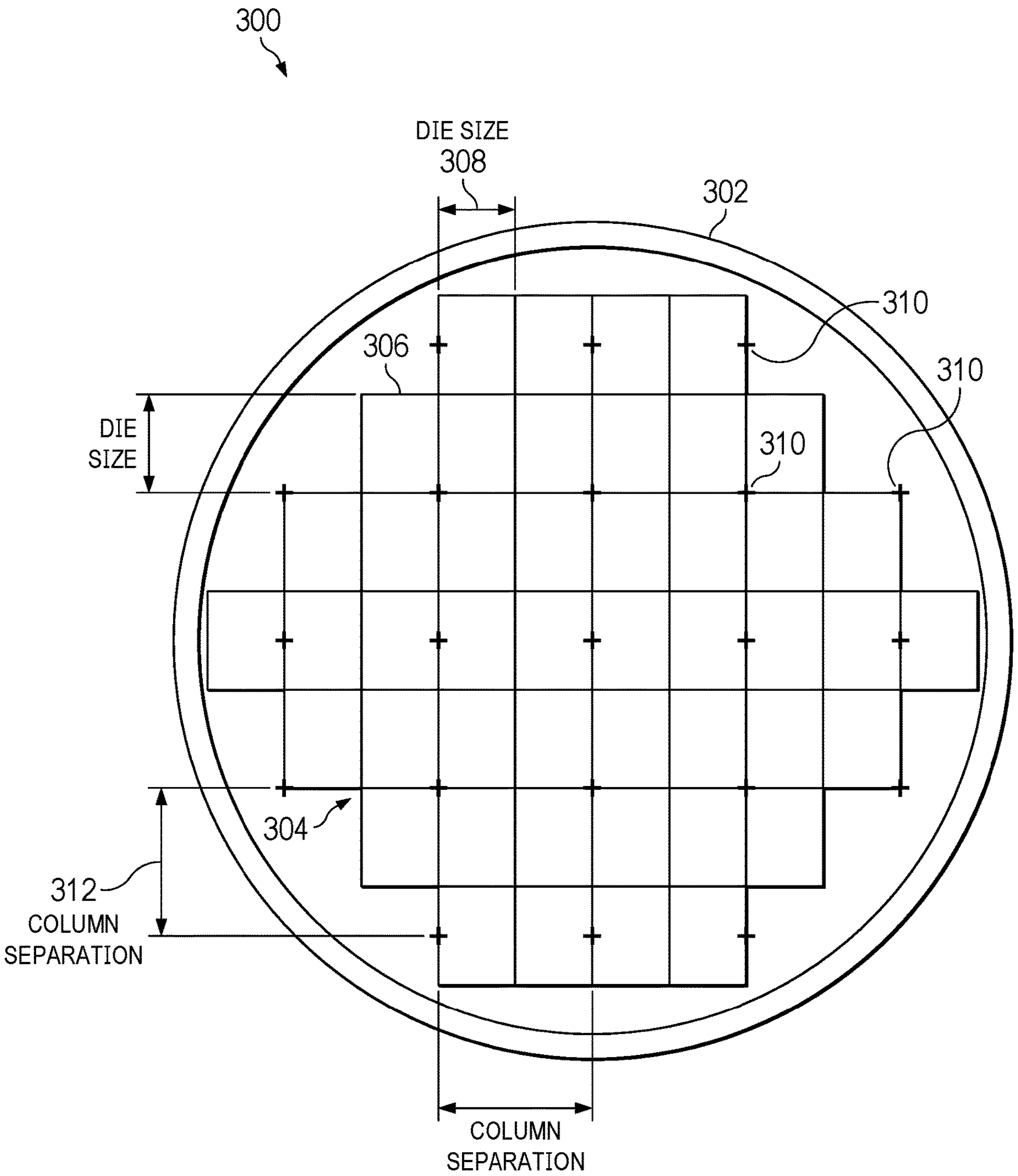
FIG. 3B shows the example semiconductor wafer of FIG. 3A, with markings indicating parameters related to fabrication and to an array of charged particle beam columns mounted above the semiconductor wafer.

FIG. 3B shows the example semiconductor wafer 300 of FIG. 3A, with markings indicating parameters related to fabrication and to an array 202 of charged particle beam columns 102 mounted above the semiconductor wafer 300. The beam column array 202 is not shown in FIG. 3B. Dies 306 fabricated on the semiconductor wafer 300 have length and width measurements that make up respective die sizes 308. After fabrication, the semiconductor wafer 300 is diced to form separated dies 306. Additional spacing between dies 306 to facilitate dicing is not shown.

In some examples, charged particle beam columns 102 can be used to write features onto the semiconductor wafer 300; modify doping or other internal structure of the semiconductor wafer 300; or perform imaging to facilitate writing, modification, defect detection, or other processing of the semiconductor wafer 300. As described, a beam column array 202 can be used to process the semiconductor wafer 300. Example locations of centers of column apertures 122 projected onto the substrate surface 304, corresponding to intended undeflected landing locations 310 of corresponding charged particle beams 114, are indicated by crosses. These intended undeflected landing locations 310, corresponding to centers of column apertures 122, indicate column separation 312—accordingly, column-to-column spacing 312. In some examples, die sizes 308 and column-to-column spacing 312 do not correspond. Instead, column separation 312 indicates sizes of writing areas 302 of respecting charged particle beam columns 102. In some examples, a charged particle beam columns 102 in an array 202 can have column-to-column spacing 312 of 30 mm×30 mm; in some other examples, column-to-column spacing 312 can be 24 mm×33 mm.

A stripe is the portion of the substrate surface 304 that a charged particle beam 114 can target while the stage 108 is moving predominantly in a single direction, i.e., before the stage 108 moves laterally and switches predominant directions to give the charged particle beam 114 access to a different stripe. A frame is the portion of the substrate surface 304 that a charged particle beam 114 can target at a given time, corresponding to the main-field deflection area at that time. The main-field deflection area is designated by the design layout database. The design layout database contains the information needed for a charged particle beam column 102 or beam column array 202 to process a workpiece 110 such as the semiconductor wafer 300. A frame is typically designated to be rectangular, for convenience (e.g., to tile the writing area); and smaller than the furthest extent to which the beam can be deflected (e.g., to preserve beam targeting accuracy).

Figure 4C:
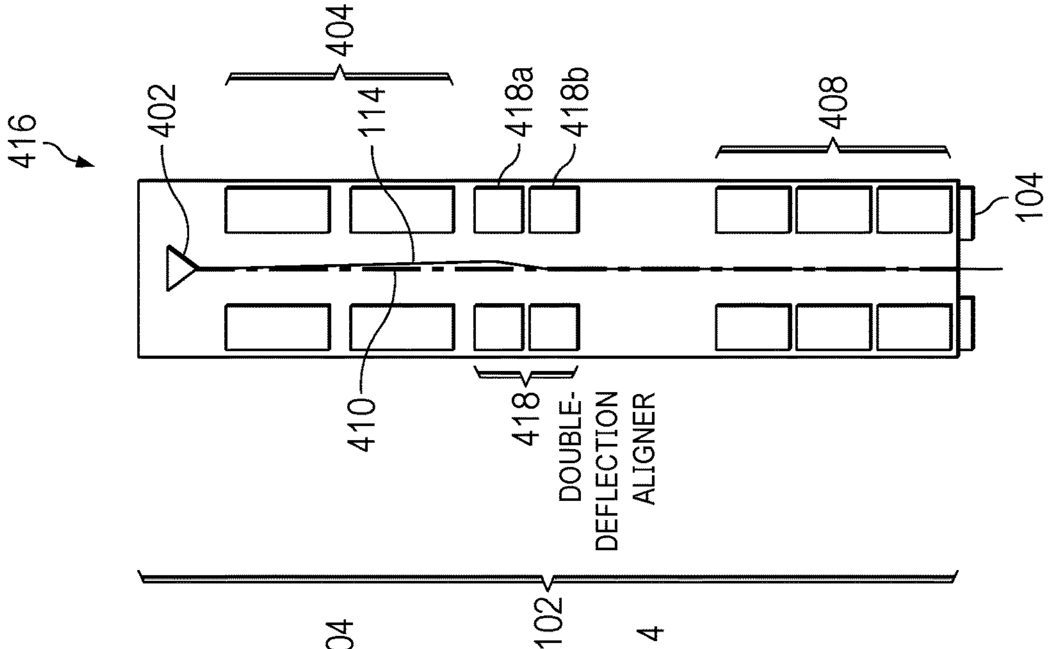
FIG. 4C shows a functional block diagram of the charged particle beam column, the charged particle beam detector, and a corresponding charged particle beam.
Figure 4B:
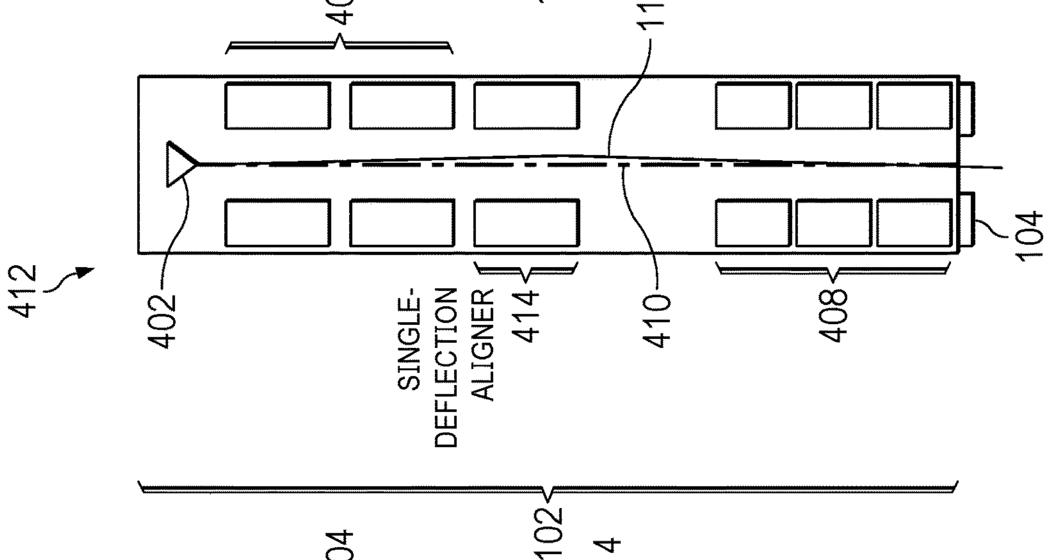
FIG. 4B shows a functional block diagram of the charged particle beam column, the charged particle beam detector, and a corresponding charged particle beam.
Figure 4A:
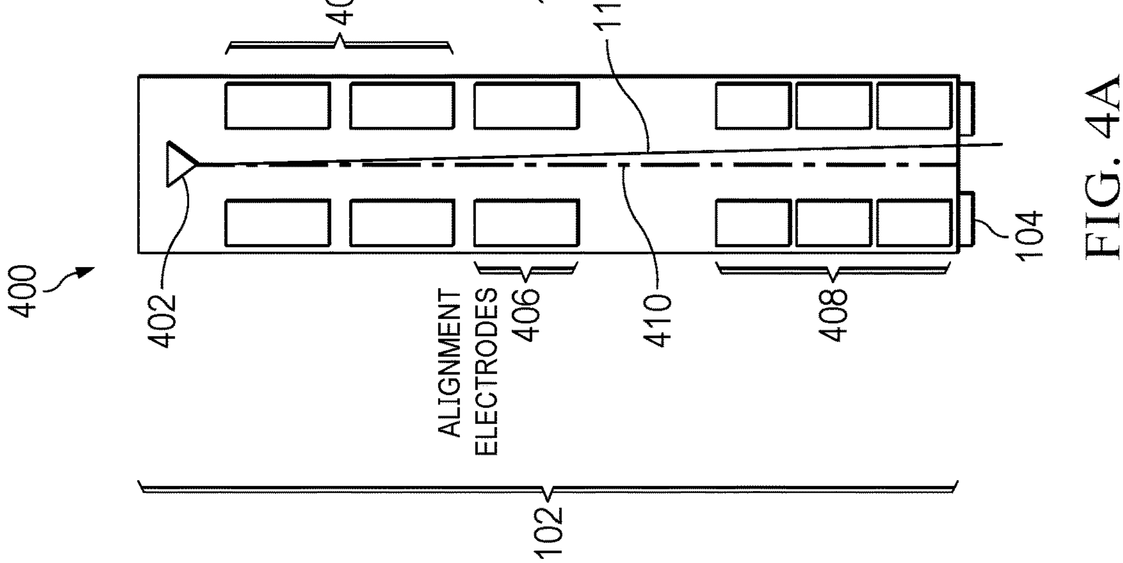
FIG. 4A shows a functional block diagram of the charged particle beam column, the charged particle beam detector, and a corresponding charged particle beam.

FIG. 4A shows a functional block diagram 400 of the charged particle beam column 102, the charged particle beam detector 104, and a corresponding charged particle beam 114. The charged particle beam column 102 includes an electron source 402, an electron gun 404, one or more sets of alignment electrodes 406, a main lens 408, and the charged particle detector 104. The central axis of the charged particle beam column 102 is an axis of rotational symmetry within an interior of the charged particle beam column 102. The optical axis 410 of the charged particle beam column 102 is a line from the electron source 402 to the aperture 122 so electrostatic (or magnetostatic) fields applied to focus a charged particle beam 114 traveling along the optical axis 410 will exhibit rotational symmetry. That is, the charged particle beam column 102 could be rotated around a charged particle beam 114 traveling along the optical axis 410, and the charged particle beam 114 would have the same focus profile at the aperture 122 as prior to the rotation.

In some examples, if the charged particle beam column 102 components are machined and aligned to perfect tolerance (zero deviation from design), then the optical axis 410 will be the same as the central axis, and the central axis would be perfectly perpendicular to the wafer 300 or other workpiece 110. In some examples, the terms optical axis and central axis are used interchangeably. A charged particle beam 114 travelling along the central axis 410 can be acted upon with equal magnitude by different, equally-charged portions of electrostatic or magnetostatic elements of the charged particle beam column 102 that are distributed at different locations in a plane perpendicular to the optical axis 410, such as second electrostatic element 502*b* and the fourth electrostatic element 502*d* (see FIG. 5A).

The centroid of the charged particle beam 114 is a line—a one-dimensional curve in three-dimensional space—formed by the centers of charge distribution in successive cross-sectional slices of the charged particle beam 114 perpendicular to the optical axis 410. The centers of charge distribution can be thought of as similar to centers of mass. The line used to indicate the charged particle beam 114 in the figures indicates the centroid of the charged particle beam 114.

Accuracy and conformance of beam shape and charge distribution to design are improved if the centroid of the charged particle beam 114 is aligned to (travels along) the optical axis 410 of the charged particle beam column 102. The centroid can be calculated in the plane perpendicular to the optical axis from the charge distribution $\rho(\vec{x})$ and is found along the position vector $\vec{X}$ described in Equation 1:

$$\vec{X} = \frac{\iint \rho(\vec{x})\vec{x}\,dA}{\iint \rho(\vec{x})\,dA} \qquad \text{Equation 1}$$

The double integrals are over the two dimensional planes perpendicular to the optical axis 410 along the length of the beam. (In some examples, it may be reasonable to integrate, for example, over planes perpendicular to the central axis or the centroid of the charged particle beam 114 as close approximations.) The position vector $\vec{X}$ corresponds to a line (a one dimensional curve in three dimensional space) formed by the centers of charge distribution of cross-sections of the beam perpendicular to a direction of the beam's travel. The centroid $\vec{X}$ can also be thought of as a center-line of the beam. In some examples, the centroid of the beam is not a straight line.

The position of the centroid of the charged particle beam 114 with respect to the optical axis 410 of the charged particle beam column 102 affects the focusing characteristics of the charged particle beam 114. Charged particle beams 114 can be deflected by electric and magnetic fields. Deflecting a charged particle beam 114 changes its relative distance to the optical axis 410 by applying a force vector 504 (see FIGS. 5A and 5B) to the charged particle beam 114 perpendicular to the optical axis 410. The electric or magnetic fields can be configured to cause the charged particles of the charged particle beam 410 to travel along a new desired trajectory along the optical axis of the main lens 160, resulting in fewer spherical aberrations when focusing or de-focusing the beam.

Disalignment of the centroid of the charged particle beam 114 from the optical axis 410 of the charged particle beam column 102 causes spherical aberration effects introduced by focusing lenses to increase. In optical lenses, spherical aberration is caused by the outer parts of a lens not bringing light rays into the same focus as the central part of the lens. In electrical and magnetic field lenses, spherical aberration is caused by the difference in focusing strength between charged particles travelling closer to the optical axis 410 and those travelling farther away from the optical axis 410—magnetic field strength varies proportionally to the inverse cube of distance.

Disalignment of the centroid of the charged particle beam 114 from the optical axis 410 can be caused by, for example, asymmetry of magnetostatic or electrostatic elements, such as focusing, deflecting, aligning, or beam shaping elements (collectively, optical elements). Another cause of deviation of the centroid from the optical axis is part-to-part offset. That is, due to assembly or machining tolerances, optical elements may be offset with respect to each other, or with respect to the charged particle beam column 102 as a whole, as a displacement a plane perpendicular to the central axis, or may be tilted at an angle from the central axis. For example, two or all of F1 140, F2 148, and F3 150 may be offset from each other. Additionally, a thermal change can cause parts of the charged particle beam column 102 to shift with respect to each other.

Increased spherical aberration leads to non-designed increases in the beam spot size, which is the size of a cross-section of the charged particle beam 114 where the charged particle beam 114 intersects the substrate surface 304. This area of intersection between the charged particle beam 114 and the substrate surface 304 is also referred to as the landing location or landing position of the charged particle beam 114. Increased beam spot size decreases resolution and makes it more difficult to deliver a designed dose of charged particles to a targeted location on the workpiece 110. Also, changing focusing lens field strength (for example, main lens 160 field strength) will also cause the landing position of the centroid of the charged particle beam 114 to change if, within the charged particle beam column 102, the centroid of the charged particle beam 114 is not aligned with the optical axis 410. As described above, the deflector 156 is intended to change the landing position of the charged particle beam 114, while the main lens 160 is intended to focus the charged particle beam 114.

Electrostatic or magnetostatic deflectors within the column can be employed to change the trajectories of the charged particle beam 114 as the charged particle beam 114 passes through the alignment electrodes 406, to reduce deviation of the centroid of the charged particle beam 114 from the optical axis 410. As described above, the charged particle beam 114 is shaped so that a central portion of a cross-section of the charged particle beam 114 has higher charge density than a peripheral portion of the cross-section of the charged particle beam 114. Accordingly, aligning the centroid of the charged particle beam 114 to the optical axis 410 within the charged particle beam column 102 reduces spherical aberration for the largest number of electrons, reducing or minimizing total spherical aberration of the charged particle beam 114.

In some examples, the uncorrected deviation of the charged particle beam 114 from the optical axis 410 is relatively large, such as 100 microns (micrometers) or more, while the deflection from the optical axis 410 applied to the charged particle beam 114 by the deflector 156 is relatively small, such as less than 10 microns. In some examples, a 100 micron deviation from the optical axis 410 corresponds to relatively large distortions due to spherical aberrations, while a sub-10 micron deviation from the optical axis 410 corresponds to relatively small or negligible distortions due to spherical aberrations. Accordingly, in some examples, a force vector and corresponding deflection angle applied by the alignment electrodes 406 results in a larger change in beam trajectory through the main lens than a force vector and corresponding deflection angle applied by the deflector 156.

FIG. 4B shows a functional block diagram 412 of the charged particle beam column 102, the charged particle beam detector 104, and a corresponding charged particle beam 114. In the example of the diagram 412, the charged particle beam column 102 includes a single-deflection aligner 414 for aligning the centroid of the charged particle beam 114 to the optical axis 410. In some examples, the single-deflection aligner 414 is able to cause the charged particle beam 114 to intersect the optical axis 410 at a selected point, but is not able to cause the charged particle beam 114 to travel along the optical axis 410 for an extended length. In some examples, the single-deflection aligner 414 reduces aberrations sufficiently, depending, for example, on system requirements.

FIG. 4C shows a functional block diagram 416 of the charged particle beam column 102, the charged particle beam detector 104, and a corresponding charged particle beam 114. In the example of the diagram 416, the charged particle beam column 102 includes a double-deflection aligner 418 for aligning the centroid of the charged particle beam 114 to the optical axis 410. In some examples, the double-deflection aligner 418 includes multiple rings of alignment electrodes 406 configured so that the charge strengths of different portions of the different rings of alignment electrodes 406 can be independently selected. Accordingly, the double-deflection aligner 418 is able to align the charged particle beam 114 so that it travels along the optical axis 410 for an extended length, further reducing aberrations when compared to the single-deflection aligner 414. A first ring 408*a* of the alignment electrodes 406 of the double-deflection aligner 418 deflects the charged particle beam 114 so that the charged particle beam 114 intersects the optical axis 410 near a second ring 408*b* of the alignment electrodes 406 of the double-deflection aligner 418. The second ring 408*b* of the alignment electrodes 406 of the double-deflection aligner 418 deflects the charged particle beam 114 so that the charged particle beam 114 travels along the optical axis 410.

Figure 5A:
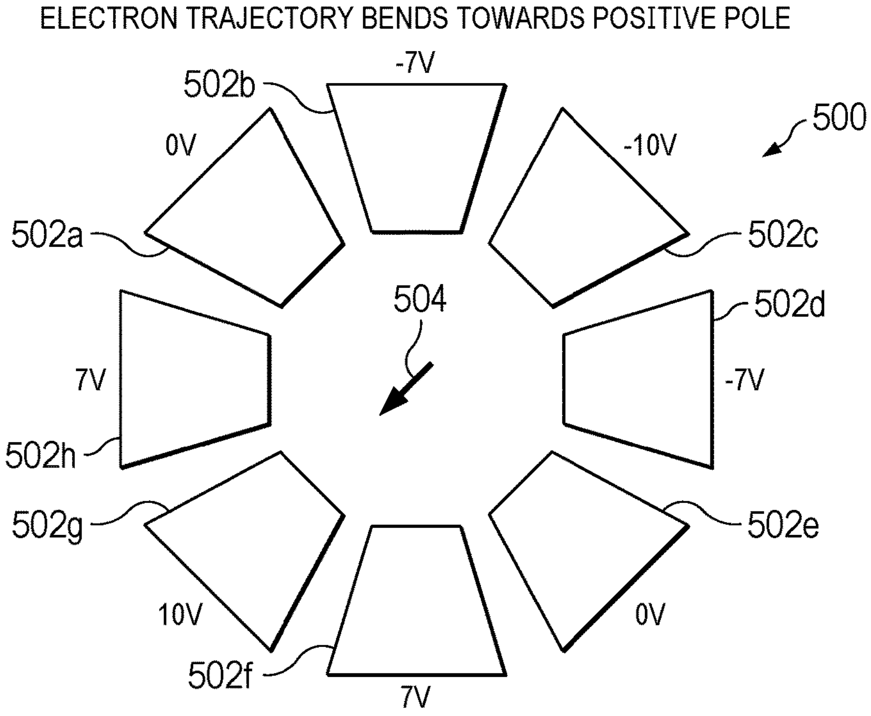
FIG. 5A shows a functional block diagram of an example octopole deflector for aligning or otherwise deflecting a charged particle beam.

FIG. 5A shows a functional block diagram of an example octopole deflector 500 for aligning or otherwise deflecting a charged particle beam 114. The octopole deflector 500 includes a first electrostatic element 502*a* charged with zero volts (V), a second electrostatic element 502*b* charged with −7 V (or, more precisely, $-10\times2^{-0.5}$ V), a third electrostatic element 502*c* charged with −10 V, a fourth electrostatic element 502*d* charged with −7V, a fifth electrostatic element 502*e* charged with zero V, a sixth electrostatic element 502*f* charged with 7, a seventh electrostatic element 502*g* charged with 10 V, and an eighth electrostatic element 502*h* charged with 7 V, collectively the electrostatic elements 502. Accordingly, the octopole deflector 500 will apply a force vector 504 to a charged particle beam 114 passing near the optical axis 410 of the charged particle beam column 102 that is oriented from the third electrostatic element 502*c* towards the seventh electrostatic element 502*g*. Different charges on different ones of the electrostatic elements 502 enables the octopole deflector 500 to apply force vectors 504 with different magnitudes and different orientations to the charged particle beam 114 in order to align the charged particle beam 114 with the optical axis 410. Similar changes in charge can also be used to deflect the charged particle beam 114 to have different landing positions within a corresponding frame.

Figure 5B:
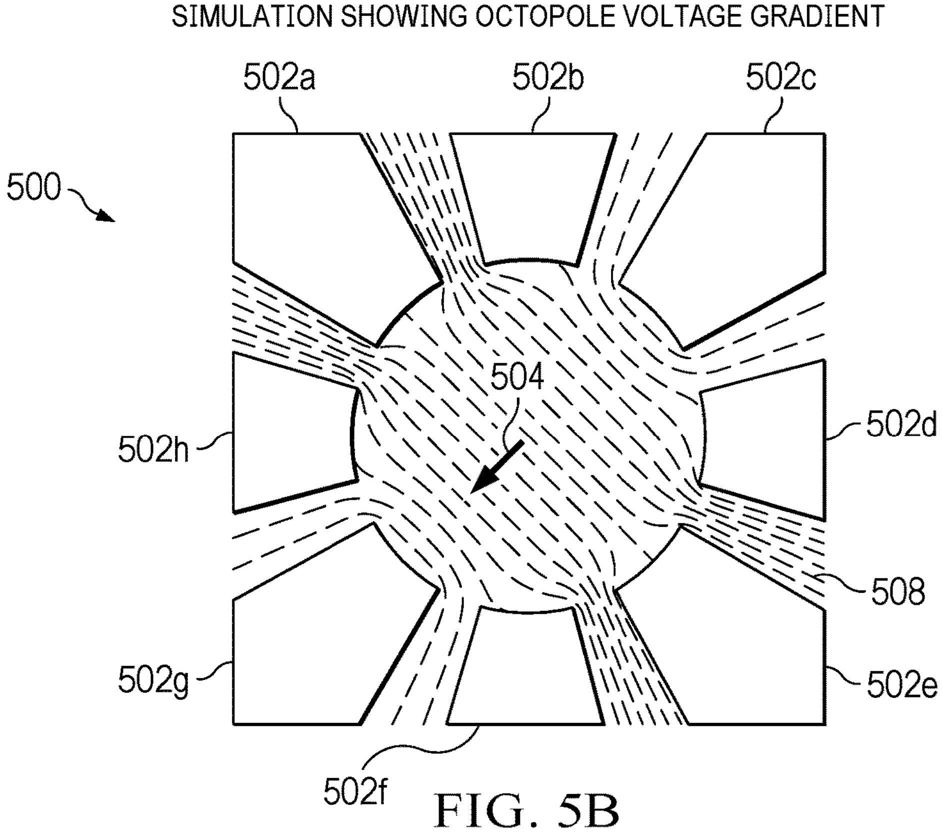
FIG. 5B shows an example simulation of the octopole deflector of FIG. 5A.

FIG. 5B shows an example simulation 506 of the octopole deflector 500 of FIG. 5A. The simulation shows equipotential lines 508 describing a voltage gradient, illustrating that the negatively charged electrostatic elements 502 exert force repelling the negatively charged, charged particle beam 114, and the positively charged electrostatic elements 502 exert force attracting the charged particle beam 114. The field lines shown (the equipotential lines 508) are similar to a topological map, and describe lines of equal potential. Electrons in the charged particle beam 114 are pushed down the voltage gradient described by the equipotential lines 508, so that force vectors 504 exerted by the field on electrons run perpendicular to the equipotential lines 508.

Figure 6:
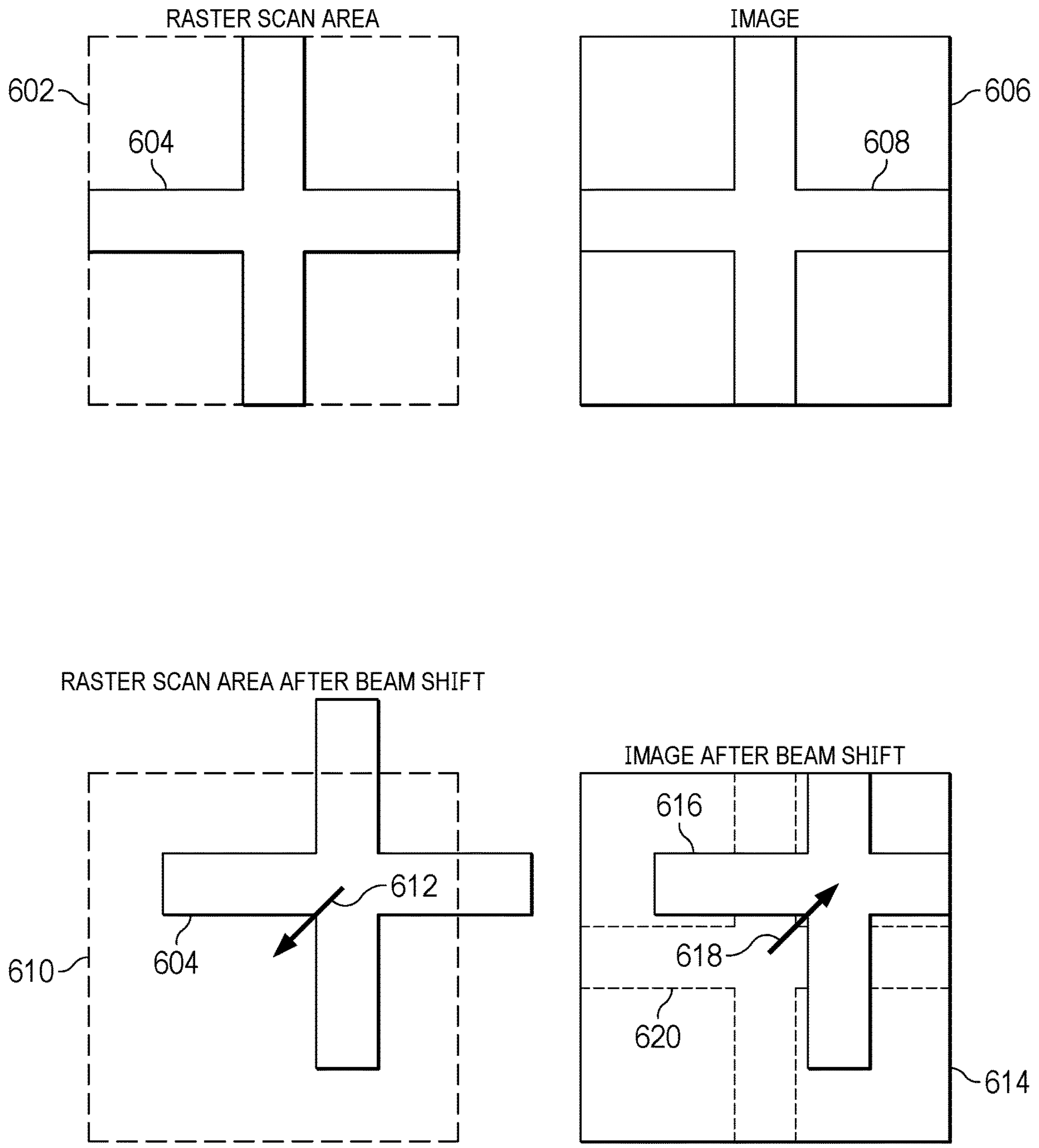
FIG. 6 illustrates example raster scan areas scanned by a charged particle beam with corresponding images.

FIG. 6 illustrates example raster scan areas scanned by a charged particle beam 114 with corresponding images. The charged particle beam 114 is scanned, using a raster pattern, across a first raster scan area 602 that includes a calibration target 604. The first raster scan area 602 is located and sized to capture a first image 606 with a calibration target first image 608 that includes all of the calibration target 604, without excess scan area. The scan area can be shifted, by adding a deflection to the charged particle beam 114 or by using the substrate positioning system 108 to move the stage 108 (or both), to capture a second raster scan area 610. The second raster scan area 610 is the same size as the first raster scan area 602, but is displaced from the first raster scan area 602 in a direction indicated by the arrow 612. Note that the calibration target 604 appears to move from the first raster scan area 602 to the second raster scan area 610 in a direction opposite to the arrow 612. The resulting second image 614 includes a calibration target second image 616 displaced from the calibration target first image 608 in a direction indicated by an arrow 618. For comparison, the in-image location 620 of the calibration target first image 608 is included in the second image 614.

Figure 7:
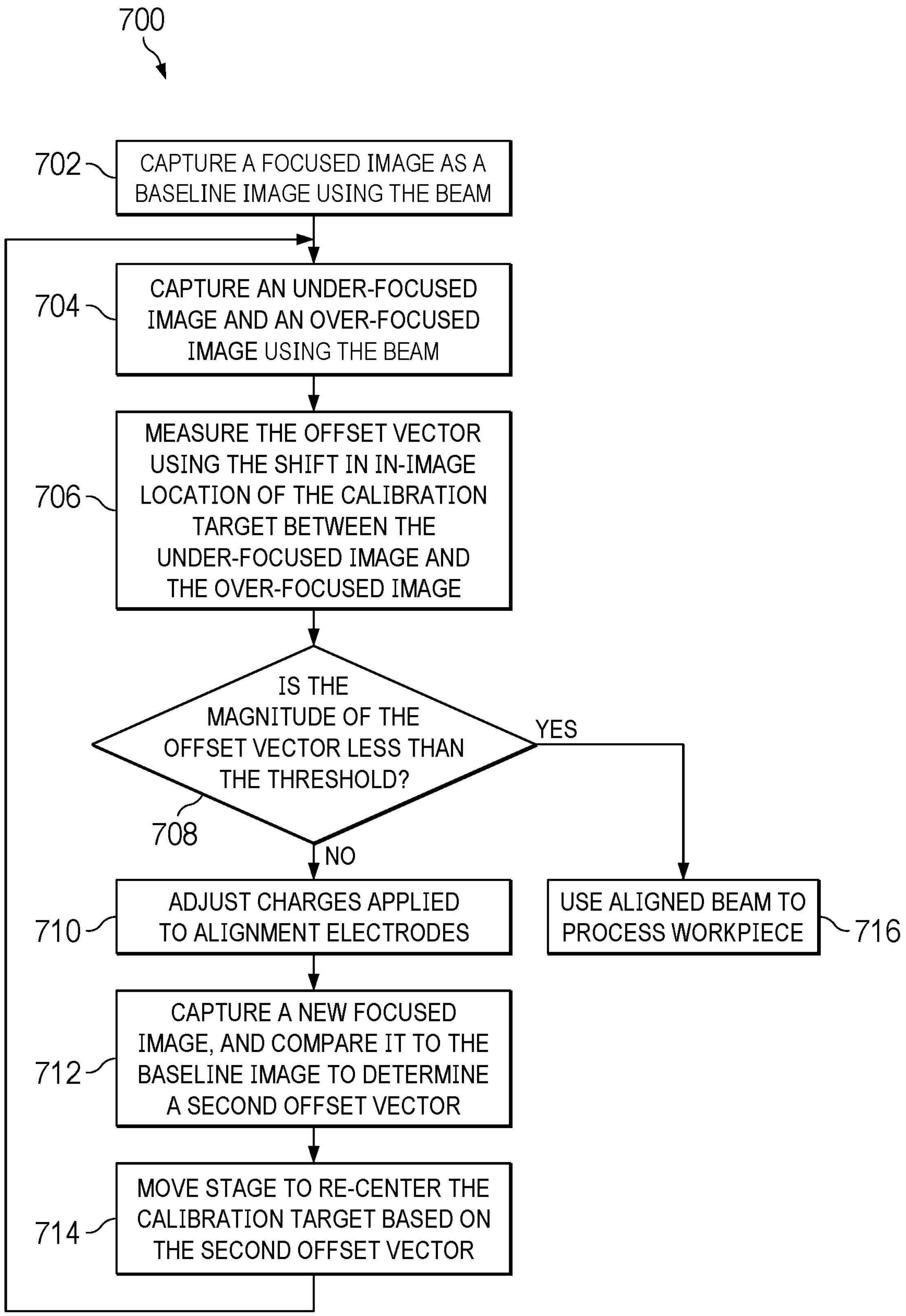
FIG. 7 illustrates a process for measuring the deviation of the centroid of the charged particle beam from the optical axis of a corresponding charged particle beam column using computer vision analysis.

FIG. 7 illustrates a process 700 for measuring the deviation of the centroid of the charged particle beam 114 from the optical axis 410 of a corresponding charged particle beam column 102 using computer vision analysis. In step 702, a focused image $I_f$ of a calibration target 604 is captured as a baseline image for the stage 108 control loop. Focused, over-focused, and under-focused images captured during the process 700 are frame sized or smaller; the stage 108 is not moved during image capture. In some examples, captured images are approximately 30 microns by 30 microns in size. A focused image is an image captured while the charged particle beam 114 is a focused beam 804 (in a focused state, see FIG. 8). The calibration target 604 is a pattern on the workpiece 110 with at least one non-repeating feature that can be recognized by a vision system that exhibits contrast to a charged particle beam 114. In other words, the calibration target 604 is a pattern on the workpiece 110 that will cause charged particles that intersect the calibration target to be backscattered (or to cause emittance of secondary electrons) in a manner characteristic of the calibration target 604, rather than the workpiece 110 or other pattern fabricated on the workpiece 110. For example, a calibration target 604 can include circles, crosses, and squares, as well as other more specific features such as Hadamard marks.

In step 704, the charged particle beam column 102 targets a calibration target 604 and uses the charged particle beam 114 to capture an under-focused image $I_u$ 902 (see FIG. 9) of the calibration target 604 and an over-focused image $I_o$ 904 of the calibration target 904. An under-focused image is an image captured while the charged particle beam 114 is an under-focused beam 806 (in an under-focused state). An over-focused image is an image captured while the charged particle beam 114 is an over-focused beam 802 (in an over-focused state).

Figure 8:
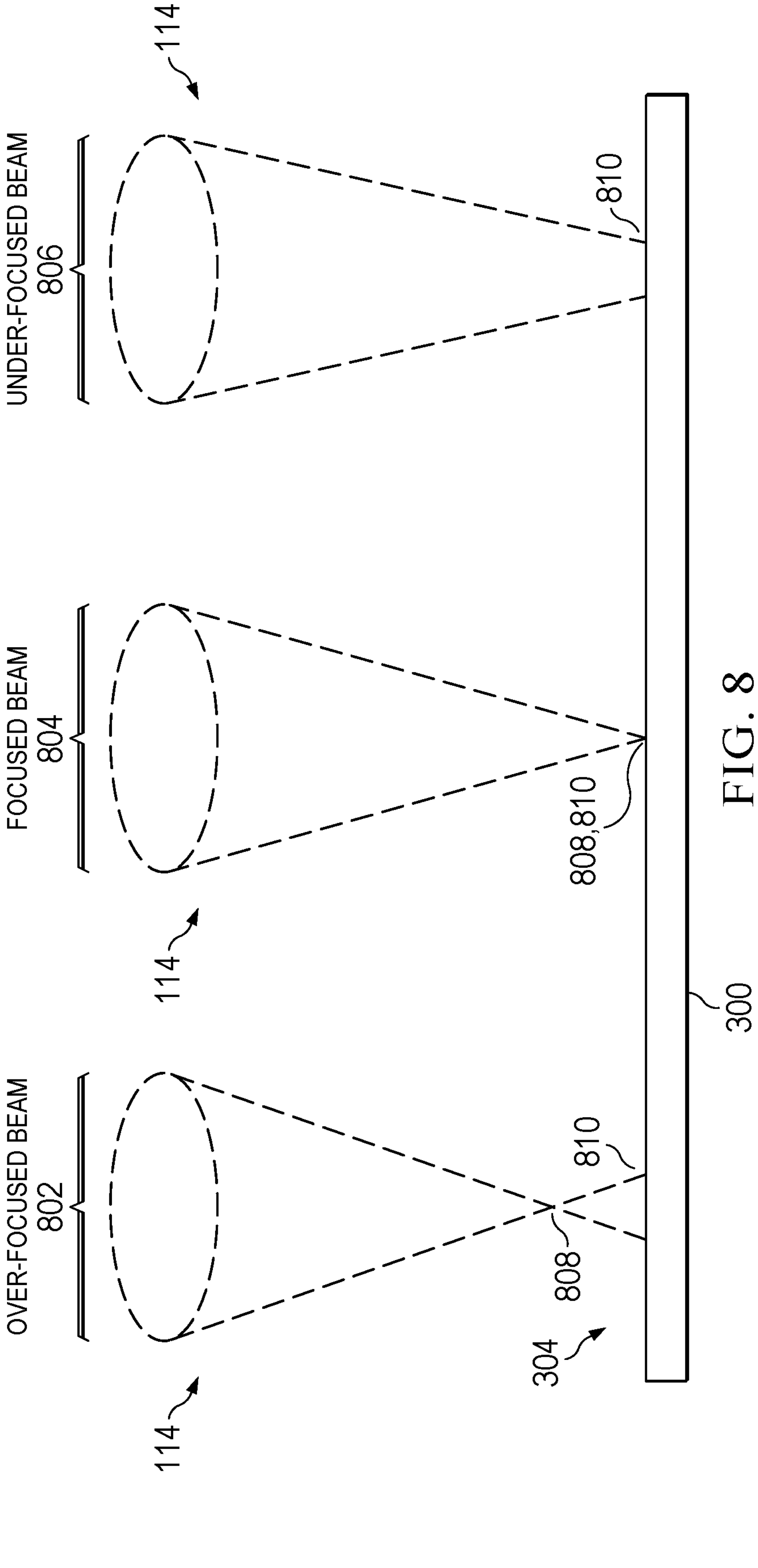
FIG. 8 illustrates a charged particle beam intersecting a substrate surface when the charged particle beam is an over-focused beam, a focused beam, or an under-focused beam.

FIG. 8 illustrates a charged particle beam 114 intersecting a substrate surface 304 when the charged particle beam 114 is an over-focused beam 802, a focused beam 804, or an under-focused beam 806. An over-focused beam 802 converges to a minimally-sized (in-focus) spot 808 while in a plane between the charged particle beam column 102 and the substrate surface 304. As described above, a spot is a cross-sectional shape applied to the charged particle beam 114 by shaping elements of the charged particle beam column 102. A focused beam 804 converges to a minimally-sized spot 808 at the plane of the substrate surface 304 (also referred to as the imaging plane). An under-focused beam 806 would converge to a minimally-sized spot 808 (corresponding minimally-sized spot 808 not shown) in a plane beyond the substrate surface 304.

Figure 9:
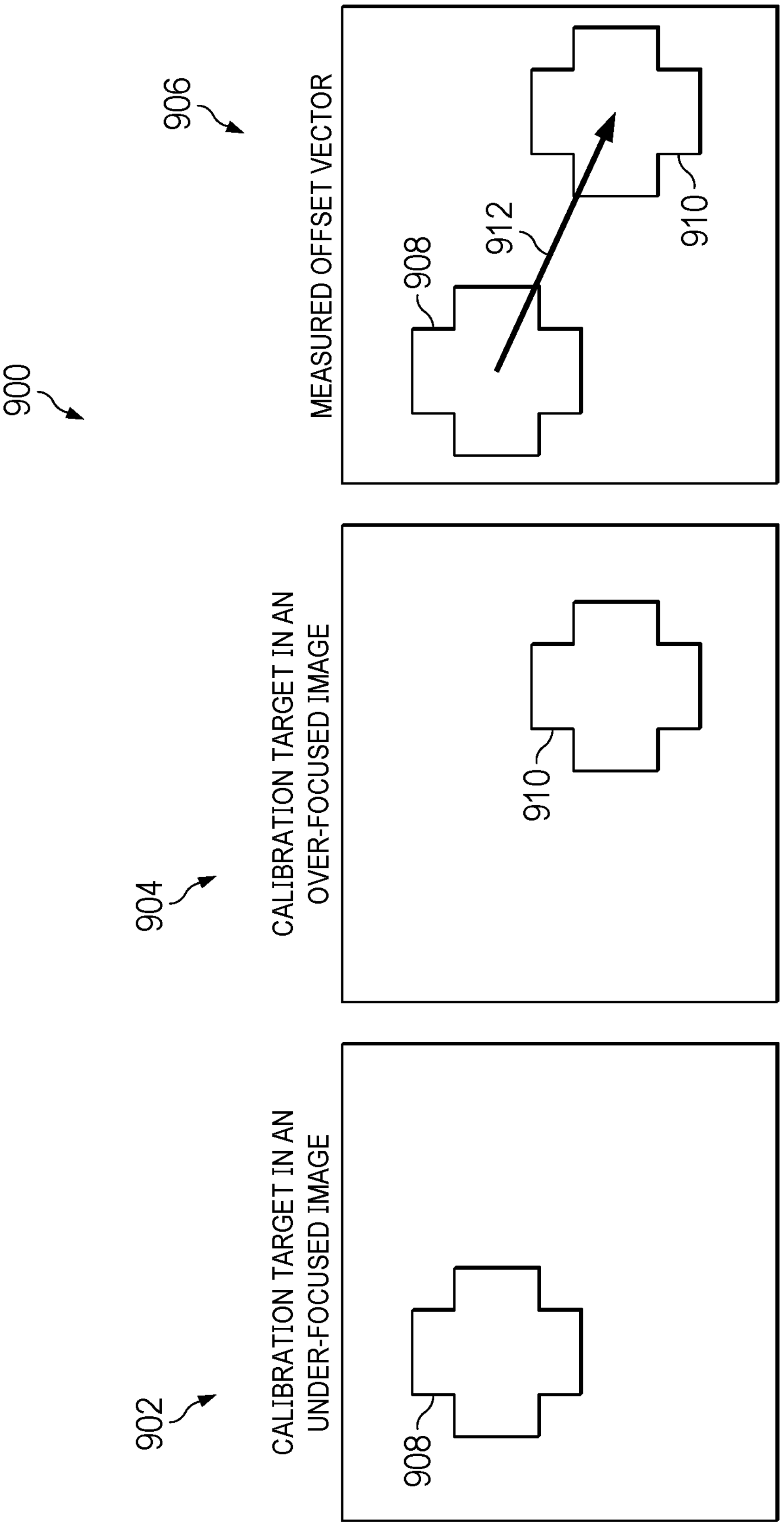
FIG. 9 illustrates an under-focused image of the calibration target captured by an under-focused beam, an over-focused image of a calibration target captured by an over-focused beam, and a composite image showing a shift in the in-image location of the calibration target from the under-focused image to the over-focused image.

Returning to FIG. 7, in step 706, computer vision analysis is used to measure a shift in beam landing position between the first image 902 and the second image 904. FIG. 9 illustrates an under-focused image $I_u$ 902 of the calibration target 604 captured by an under-focused beam 806, an over-focused image $I_o$ 904 of a calibration target 604 captured by an over-focused beam 802, and a composite image 906 (not a separate captured image) showing a shift 912 in the in-image location of the calibration target 604 from the under-focused image $I_u$ 902 to the over-focused image $I_o$ 904. Due to the physics of charged particle optics (e.g., electrostatic or magnetostatic beam focusing or deflecting elements), the beam landing position 810 shifts between the under-focused image $I_u$ 902 and the over-focused image $I_o$ 904 if the charged particle beam 114 is travelling off-axis with respect to the optical axis 410. The beam landing position remains constant (or approximately constant) if the charged particle beam 410 is aligned to travel along the optical axis 410.

The direction of the beam landing position shift is the opposite of the direction of the shift 912 in the in-image location of the calibration target 604. The direction and magnitude of the beam landing position shift 912 together make up an offset vector (also referred to as a shift vector). The process 700 uses the offset vector determined using the under-focused image $I_u$ 902 and the over-focused image $I_o$ 904 as feedback information to conform the charged particle beam 114 to the optical axis 410 of the charged particle beam column 102. This is performed iteratively and automatically (without user intervention) by comparing the under-focused image $I_u$ 902 to the over-focused image $I_o$ 904 and tuning the voltages on (charges on the poles of) the alignment electrodes 406 accordingly.

Returning to step 706 in FIG. 7, the offset vector is measured using the shift 912 in in-image location from the calibration target image 908 in the under-focused image $I_u$ 902, to the calibration target image 910 in the over-focused image $I_o$ 904. The images are recorded by the control system 108 and compared by the control system 108 using computer vision analysis. The pixel shift between the features within the under-focused image $I_u$ 902 and the over-focused image $I_o$ 904 is measured as the offset vector $\vec{S}$ (S for shift), as shown in Equation 2:

$$\vec{S} = f(I_u, I_o) \quad \text{Equation 2}$$

The function $f$ determines the measured offset vector $\vec{S}$ as a function of the images $I_u$ 902 and $I_o$ 904. In some examples, a cross-correlation function can be used as the function $f$ of Equation 2. For two M×N images $I_1$ and $I_2$, a function $(I_1 * I_2)[k, l]$ is defined at a pixel (k, l) as given by Equation 3:

$$(I_1 \star I_2)[k, l] = \sum_{m=0}^{M-1} \sum_{n=0}^{N-1} I_1(m, n) I_1(m-k, n-l) \quad \text{Equation 3}$$

The function $(I_1 * I_2)[k, l]$ can be thought of as a windowed sum of multiplications between the two images that measures similarity between the pixels in the two images. In other words, the function $(I_1 * I_2)[k, l]$ can be described as a cost function that tracks motion between under-focused and over-focused images, enabling calibrating the alignment electrodes 406 to reduce or minimize the tracked motion, which reduces or minimizes deviation of the charged particle beam 114 from the optical axis 410. The pixel $(k_{MAX}, l_{MAX})$, where this function has a maximum, indicates a shift 912 that corresponds to a maximum overlap between the images $I_u$ 902 and $I_o$ 904. If $(k_{MAX}, l_{MAX})$ is located at the center of the cross-correlation, the images $I_u$ 902 and $I_o$ 904 have no shift 912 between them. The center of the cross-correlation is the center of the respective images $I_u$ 902 and $I_o$ 904, at pixel (M/2, N/2) of each of the images $I_u$ 902 and $I_o$ 904. If $(k_{MAX}, l_{MAX})$ is located other than at the center of the respective images $I_u$ 902 and $I_o$ 904, the distance of $(k_{MAX}, l_{MAX})$ from the center of the cross-correlation equals the magnitude of the shift 912, i.e., the magnitude of the offset vector $\vec{S}$. The pixel $(k_{MAX}, l_{MAX})$ can be determined as a vector position $\vec{z}$ using Equation 4:

$$\vec{z} = \underset{(k,l)\in P}{\text{argmax}}(I_1 \star I_2)[k, l] \qquad \text{Equation 4}$$

The vector $\vec{z}$ indicates a position $\vec{z}=[k, l]^T$ (expressed as a column vector). The argmax function selects the position (k, l) where the value of $I_1*I_2$ is a maximum, i.e., ($k_{MAX}$, $l_{MAX}$). The offset vector $\vec{S}$ can be determined as shown by Equation 5:

$$\vec{S} = f(I_1, I_2) = \vec{z} - \left[\frac{M}{2}, \frac{N}{2}\right]^T \qquad \text{Equation 5}$$

That is, Equation 5 determines the distance and direction from ($k_{MAX}$, $l_{MAX}$) to the center of the cross-correlation. As described above, the shift 912 between the images $I_u$ 902 and $I_o$ 904 is increased when the charged particle beam 114 is not travelling down the optical axis 410, and is decreased (or minimized) when the charged particle beam 114 is travelling close to or in alignment with the optical axis 410 (the latter condition also corresponding to the charged particle beam 114 most nearly conforming to its designed cross-sectional shape). Reducing or minimizing the shift 912 corresponds to reducing or minimizing the offset vector $\vec{S}$. Accordingly, the objective of the process 700 is to find a configuration of the poles of the alignment electrodes 406 that minimizes the magnitude of the offset vector $\vec{S}$, as given by Equation 6. Equation 6 expresses $\vec{S}$ in terms of its x and y components, $s_x$ and $s_y$:

$$\|\vec{S}\| = \sqrt{s_x^2 + s_y^2} \qquad \text{Equation 6}$$

Other functions $f$ to determine the offset vector $\vec{S}$ can also be used. In some examples, a neural network can be used with computer vision analysis to identify calibration targets 604 within the frame, and to draw bounding boxes around them. A distance between respective centers or corners of the bounding boxes can then be used to determine the offset vector $\vec{S}$.

In step 708, the magnitude of the offset vector $\vec{S}$ is compared to a threshold (also referred to as a tolerance). In some examples, the threshold is selected to be above a noise level of the system, and to enable the process 700 to complete quickly. In some examples, the threshold is selected in response to a designed resolution of the system (accordingly, typically, a smaller threshold is better, and as small as possible is preferred). In some examples, the threshold is selected to equal (or be slightly larger than) a minimum measurable change in the offset vector $\vec{S}$. (a minimum measurable change in a gradient of the offset vector, see Equation 8 and corresponding description below). A typical threshold is the noise floor of the system, or the typical noise-dependent offset vector magnitude measured between repeated captured images. If the magnitude of the offset vector $\vec{S}$ is below the threshold, the process 700 moves to step 716. Otherwise, the process 700 continues with step 710. Higher (less sensitive) threshold values can be imposed to reduce the number of iterations of the loop (steps 704 to 714, a feedback control loop of the process 700) to converge to an offset vector $\vec{S}$ with a magnitude less than the threshold.

In some examples, the process 700 is repeated using different imaging parameters capable of improving the minimum resolution—for example, higher resolution or smaller pixel spacing. Pixel spacing is spot-to-spot spacing, that is, the spacing between centers of sequentially illuminated spots 808 on the substrate surface 304 (charged particle beam 114 irradiation regions on the substrate surface 304). This corresponds to an incremental charged particle beam 114 deflection distance (by the deflector 158) on the substrate surface 304. In some examples, to accelerate convergence towards alignment, early iterations of the process 700 (from step 704 to step 714) are performed using a relatively larger field of view and a relatively lower resolution. For example, each pixel may be hundreds of nanometers across. This enables detection of the calibration target 604, and of relatively large shifts 912. As the process 700 converges towards alignment (offset vectors of smaller magnitude), resolution can be increased and pixel size decreased, such as to pixels that are tens of nanometers across, or less than ten nanometers across. This can be thought of as "zooming in". The increased resolution and smaller pixel size enable measurement of smaller offset vectors.

In step 710, charges applied to the alignment electrodes 406 are adjusted to change the trajectory of the charged particle beam 114 relative to the optical axis 410. In some examples, where alignment electrodes 604 are located a relatively large distance above the main lens 160 (such as tens of millimeters in a mini-column), a relatively small trajectory change in the charged particle beam 114 can be sufficient to re-align the beam along the optical axis 410 (through the main lens 160). In some examples, alignment voltages range from zero to five percent of the energy of the charged particle beam, such as from one to ten volts for a five kilovolt beam. The charges applied to the poles of the alignment electrodes 406 together apply a force vector 504 (a sum of force vectors applied by the charges on each of the poles) to the charged particle beam 114 in a plane perpendicular to the optical axis 410. In some examples, the charge configuration has a known, deterministic relationship to the applied force vector 504. This force vector $\vec{F}$ 504 can be expressed as shown in Equation 7:

$$\vec{F} = [F_x, F_y]^T \qquad \text{Equation 7}$$

The process 700 searches for a charge configuration on the alignment electrodes 406 that applies one or more force vectors $\vec{F}$ 504 that results in a magnitude of pixel shift 912 between the under-focused image $I_u$ 902 and the over-focused image $I_o$ 904 (as measured according to Equation 2) that is below the threshold. Determination of the one or more force vector(s) $\vec{F}$ 504 will be described in terms of determination of a single force vector $\vec{F}$ 504.

In some double-deflection aligner 418 examples, the first alignment electrodes 418*a* are charged to deflect the charged particle beam 114 to center the charged particle beam 114 through the second alignment electrodes 418*b* (for example, so the charged particle beam 114 intersects the optical axis 410 at the center of the second alignment electrodes 418*b*). This can be done by, for example, determining a charge distribution on the first alignment electrodes 418*a* that maximizes a sampled current of the charged particle beam 114 through the BBA 146. A known, deterministic relationship between this charge distribution and a charge distribution to center the charged particle beam 114 through the second alignment electrodes 418 can be found, for example, using physical properties of the system, or empirically, and accordingly to designed measurements and design and manufacturing tolerances. The process 700 can then be applied to determine charges on the second alignment electrodes 418*b* to reduce the magnitude of the offset vector and thereby align the charged particle beam 114 to the optical axis 410 through the main lens 160. In some examples, a force vector applied by the second alignment electrodes 418*b* is in a direction opposite to a force vector applied by the first alignment electrodes 418*a*.

Various strategies for changing the force vector $\vec{F}$ 504 can be used in iterations of the process 700 (steps 704 to 714) to cause the path of the charged particle beam 114 to converge to the optical axis 410. For example, a gradient descent method can be used, where during iterations of the process 700, charges on the alignment electrodes 406 are adjusted in both x and y directions (a length direction x and a width direction y within a plane orthogonal to the optical axis 410) as described by Equation 8. The direction of the force vector $\vec{F}$ 504 that will produce the biggest reduction in the magnitude of the offset vector $\vec{S}$ (see Equations 2 through 6) is estimated, and a change in charge configuration is applied to the alignment electrodes 406 to deflect the charged particle beam 114 in the estimated direction (Equation 7). Equation 8 describes the change in the force vector $\vec{F}_n$ applied by the alignment electrodes 406 starting with step 710 of a given iteration, to a force vector $\vec{F}_{n+1}$ to be applied by the alignment electrodes 406 starting with step 710 of a next iteration after the given iteration:

$$\vec{F}_{n+1} = \vec{F}_n - \gamma\nabla\vec{S} \quad \text{Equation 8}$$

In Equation 8, $\nabla\vec{S}$ is a gradient of the offset vector $\vec{S}$ determined while the force vector $\vec{F}_n$ is applied—that is, the change in $\vec{S}$ from when $\vec{F}_{n-1}$ is applied to when $\vec{F}_n$ is applied. Also, $\gamma$ is an adjustable scaling factor that scales the change in $\vec{F}_n$ at each iteration. The parameter $\gamma$ can be held constant during the process 700, or it can be adjusted during the process 700 to make larger or smaller changes in $\vec{F}_n$ based on the change in $\vec{S}$ between iterations. In a first iteration of the process 700, producing a first offset vector $\vec{S}$, the gradient vector can be defined as, for example, the offset vector $\vec{S}$ for that first iteration, or as the offset vector $\vec{S}$ for that first iteration with scaled-down magnitude (for example, to diminish unwanted effects from using the offset vector as the gradient for the first iteration).

In some examples, relatively larger values of $\gamma$ can be used while the magnitude of $\vec{S}$ is relatively large, to make larger changes in $\vec{F}_n$ relatively early in the process. This corresponds to relatively rapid, rough calibration. In some examples, relatively smaller values of $\gamma$ can be used as the magnitude of $\vec{S}$ (see Equation 6) decreases, so that the force vector $\vec{F}_n$ is changed by smaller and smaller proportional amounts as the charged particle beam 114 converges towards the optical axis 410. This corresponds to relatively slower, fine calibration; accordingly, the rate of convergence slowing down as the threshold is approached.

In some examples, numerical optimization methods such as the Nelder-Mead simplex method can be used to change the force vector $\vec{F}$ 504 in iterations of the process 700. Machine learning methods can also be employed to estimate the offset vector $\vec{S}$ at different values of $\vec{F}_n$ to converge the charged particle beam 114 towards the optical axis 410.

In step 712, a new focused image $I_p$ is captured using the adjusted charged particle beam 114 to generate a feedback signal to the stage 108, and the new focused image $I_p$ is compared to the baseline image $I_f$ captured in step 702. After adjusting the alignment electrodes 406, the center of the frame can shift. The center of the frame is the intended (x, y) location where an undeflected beam intersects the substrate surface 304 or other workpiece surface 204. As the goal of successive iterations is to bring the beam towards the optical axis, thereby reducing the level of spherical aberration, the spot size and/or location of the beam landing position change after iterations of the process 700 (steps 704 to 714). This change in landing position corresponds to a change in the center of the frame. The offset vector $\vec{X}$ in the image space (like $\vec{S}$ as described above with respect to the images $I_u$ and $I_o$) between the focused images $I_f$ and $I_p$ is determined using Equations 2 through 6. $\vec{X}$ is used to apply a movement $\vec{Y}$ to the stage 108, as given by Equation 9:

$$\vec{Y} = -\alpha R(\theta)\vec{X} + \vec{b} \quad \text{Equation 9}$$

In Equation 9, the movement vector $\vec{Y}$ is expressed in terms of $\vec{X}$, a scaling factor $\alpha$, a rotation matrix $R(\theta)$, and an offset vector $\vec{b}$. In some examples, the charged particle beam column 102 is rotated with respect to the x and y axes of the stage 108. The rotation matrix $R(\theta)$ matches the axes of the stage 108 to the axes of the charged particle beam column 102. The scalar $\alpha$ scales in-image shift to stage 108 movement distance. In some examples, a magnitude of the offset vector $\vec{b}$ equals zero. The movement vector $\vec{Y}$ measures how far, and in what direction, to move the stage 108 to shift the frame so that the observed offset vector $\vec{X}$ in the image space is cancelled out. In other words, $\vec{Y}$ is a movement that can be applied to the stage 108 to re-center the calibration target. Physically, $\vec{Y}$ corresponds to a movement in the two dimensional plane containing the calibration target 604.

Accordingly, in step 714, the stage 108 is moved, as specified by the movement vector $\vec{Y}$, to a new position to so that the calibration target 604 is returned to the same location within the frame as during capture of the baseline image. In some examples, the calibration target 604 is returned to the center of the frame. The stage 108 movement of step 714 restores the frame of the charged particle beam column 102 (the original focus area), enabling "apples to apples" comparisons during successive iterations of the process 700, and maintains the calibration target 604 within the frame throughout execution of the process 700. This enables the process 700 to use the same calibration target 604 across successive iterations. The step 714 movement is illustrated in FIG. 10.

Figure 10:
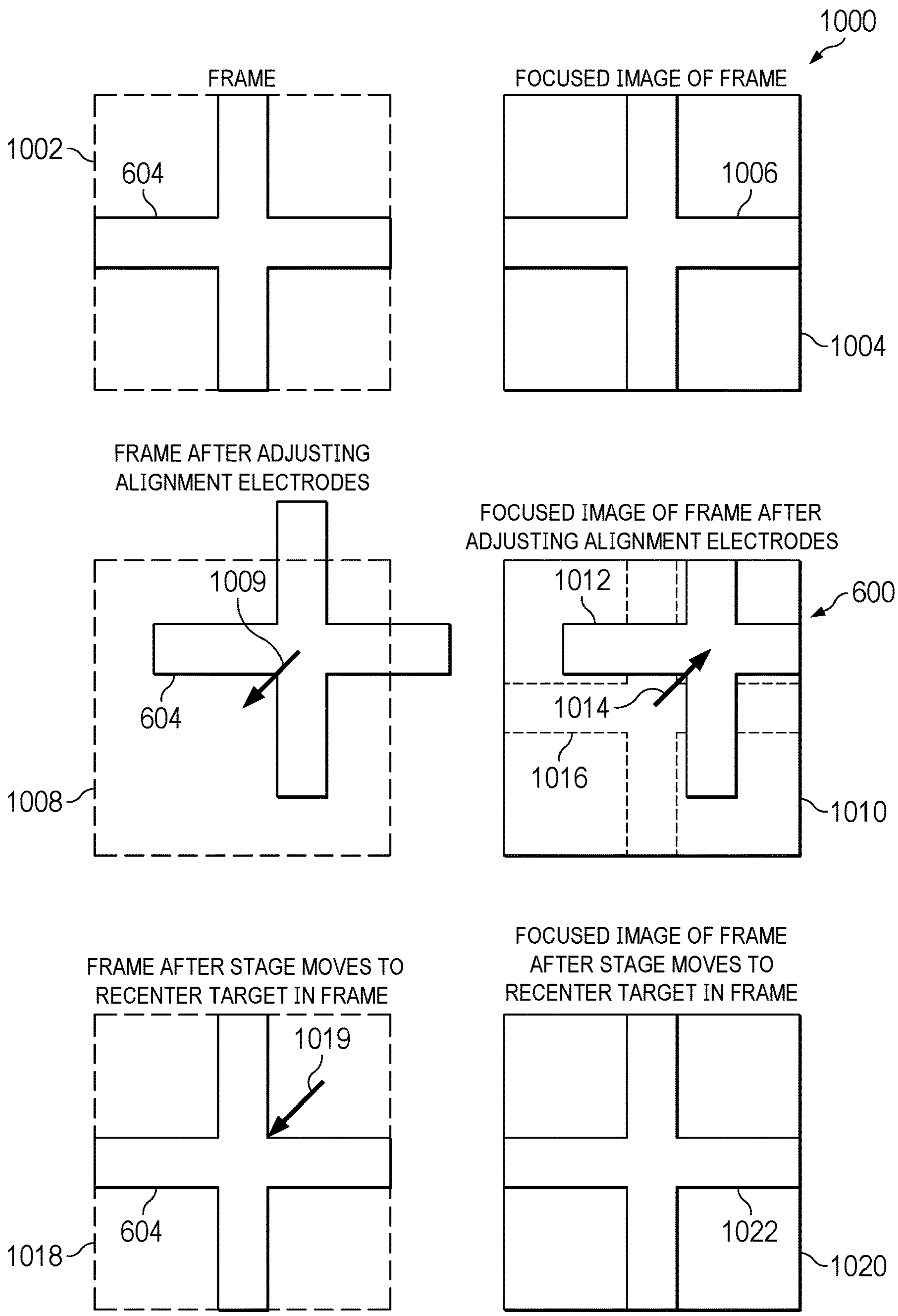
FIG. 10 illustrates the baseline image, the new focused image, and an image corresponding to the location of the frame after the stage is moved to re-center the calibration target as shown in FIG. 7.

FIG. 10 illustrates the baseline image $I_f$ of step 702, the new focused image $I_p$ of step 712, and an image (not captured during the process 700) corresponding to the location of the frame after the stage 108 is moved to re-center the calibration target 604 in step 714 as shown in FIG. 7. The frame is in a first position 1002, with the calibration target 604 centered, when the charged particle beam column 102 captures the baseline image $I_f$ 1004 in step 702. The baseline image $I_f$ 1004 includes a centered first image 1006 of the calibration target 604.

The frame is in a second position 1008, displaced from the first position 1002 due to the change in charge on the alignment electrodes 406, when the charged particle beam column 102 captures the new focused image $I_p$ 1010 of step 712. The arrow 1009 in the frame in the second position 1008 indicates direction of movement of the frame from the first position 1002 to the second position 1008. The new focused image $I_p$ 1010 includes a second image 1012 of the calibration target 604, displaced from the first image 1004 in a direction indicated by an arrow 1014. For comparison, the in-image location 1016 of the first image 1004 is included in the new focused image $I_p$ 1010.

The frame is in a third position 1018, with the calibration target 604 centered, after the stage 108 moves to re-center the calibration target 604 in the frame. The arrow 1019 in the frame in the third position 1018 indicates the direction of movement of the stage 108 from the second position 1008 to the third position 1018, compensating for the movement of the frame from the first position 1002 to the second position 1008. If the charged particle beam column 102 captured an image of the frame in the third position 1018, the resulting image 1020 would include a (approximately) centered third image 1022 of the calibration target 604.

In step 716, if the magnitude of the offset vector is less than the threshold as determined in step 708, then the loop ends and the charged particle beam 114, aligned with the optical axis 410, is used to process the workpiece 110, such as the wafer 300. In some examples, after the loop ends, the size of the frame is increased or reduced to modify the imaging resolution and, accordingly, to modify the magnitude of a minimum detectable offset vector; and the process 700 is repeated with the modified resolution. In some examples, this enables smaller offset vectors to be measured, improving the precision with which the charged particle beam 114 path is calibrated to match the optical axis 410.

The disclosed innovations, in various embodiments, provide one or more of at least the following advantages. However, not all of these advantages result from every one of the innovations disclosed, and this list of advantages does not limit the variously claimed inventive scope.

- Enables automated column calibration;
- enables reduction in re-calibration events after adjusting beam parameters;
- enables smaller minimum spot size;
- enables improved conformance of beam shape to designed beam shape;
- enables the entire calibration target to be maintained within a field of view of the charged particle beam during calibration without operator intervention;
- enables automated, fast calibration target image capture;
- enables automated, accurate, fast beam offset measurement;
- enables automated, fast beam alignment iterations, including faster adjustment of column imaging parameters;
- enables use of charged particle beam columns in automated substrate processing tools;
- increases the range of deflection voltages that can be applied;
- enables use of an automated feedback loop for increased calibration iteration rate;
- enables rapid alignment of an array of charged particle beam columns; and
- increases charged particle beam calibration accuracy and convergence rate.

Modifications and Variations

As will be recognized by those skilled in the art, the innovative concepts described in the present application can be modified and varied over a tremendous range of applications, and accordingly the scope of patented subject matter is not limited by any of the specific exemplary teachings given. It is intended to embrace all such alternatives, modifications and variations that fall within the spirit and broad scope of the appended claims.

Directions or dimensions described herein are merely provided for example and in reference to example embodiments. In some embodiments, other dimensions, directions, and/or directional orientations are used.

In some examples, charged particle beam columns 102 other than e-beam mini-columns are used.

In some examples, magnetostatic or other magnetic or electromagnetic deflector elements, focusing elements, or other beam accelerating, shaping, or targeting elements are used.

In some examples, charged particle beam column 102 elements other than or in addition to those described herein are used.

In some examples, charged particle beam column 102 elements are arranged in different locations within the charged particle beam columns 102 than shown and described herein.

In some examples, charged particle beam columns 102 other than electrostatically defected electron beam mini-columns are used.

In some examples, beam column array 202 sizes (number of columns) and configurations other than those described herein are used.

In some examples, the deflector 156 is located prior to the main lens 160 with respect to the path of the charged particle beam 114. In some examples, the deflector 156 is located after the main lens 160 with respect to the path of the charged particle beam 114.

In some examples, more than one deflector 156 is used.

In some examples, a raster area smaller than the frame is used to image the calibration target 604.

In some examples, the threshold is determined in response to a deviation tolerance of the charged particle beam 114 from the optical axis 410 corresponding to an acceptable (or negligible) level of spherical aberrations in the charged particle beam 114.

In some examples, the process 700 is performed during one or more of: initial column bring-up, periodic recalibration, scheduled recalibration, after a process excursion (a fault condition during processing of the substrate by the charged particle beam column 102), before processing a substrate, before processing a batch of multiple substrates, or after a measured temperature of the charged particle beam column 102 changes by more than a threshold.

In some examples, the offset vector can be determined with respect to shift of the calibration target image 910 in the over-focused image 904 to the calibration target image 908 in the under-focused image 902.

In some examples, the calibration target 604 is a periodic pattern with a periodicity or pitch that is more than double the maximum possible image shift 912.

In some examples, calibration targets 604 are distributed throughout the writing area of a charged particle beam column 102.

In some examples, charged particle beam columns 102 in an array 202 perform the process 700 sequentially, at separate times, to enable the stage 108 to move separately for respective columns being aligned.

In some examples, a calibration target 604 (for example, a Hadamard mark) is used that is large enough to enable the process 700 to be performed while using a fixed stage 108 position—for example, skipping steps 702, 712, and 714. Accordingly, a calibration target 604 large enough to remain within the frame throughout the process 700 without moving the stage 108, and configured to enable position to be determined using any portion of the calibration target 604 that might be within the frame during an iteration of the process 700. In some such examples, the process 700 (alignment calibration of the charged particle beam 114 to the optical axis 410) is performed by multiple charged particle beam columns 102 in an array 202 independently (different columns can use different charge distributions) and simultaneously (iterations of the process 700 performed by different charged particle beam columns 102 overlap in time).

In some examples, an array 202 can use different column-to-column spacing 312, or include charged particle beam columns 102 that are not aligned, or are aligned in non-orthogonal directions.

In some examples, an array 202 has between one and eighty-one charged particle beam columns 102.

In some examples, workpiece 110 sizes other than those described herein are used.

In some examples, workpieces 110 other than those described herein (e.g., different types of semiconductor substrate, or other than a semiconductor substrate) are used.

In some examples, calibration targets other than those described herein are used.

In some examples, the charged particle beam 114 is deflected across the substrate surface 304 in a raster pattern, a boustrophedonic pattern, or another pattern.

In some examples, the workpiece 110 is moved in a raster pattern, a boustrophedonic pattern, or another pattern.

Additional general background, which helps to show variations and implementations, may be found in the following publications, all of which are hereby incorporated by reference: U.S. Pat. Nos. 9,453,281, 9,466,464, 9,556,521, 9,822,443, 9,824,859, 9,881,817, 10,020,200, 10,607,845, 10,658,153, 10,734,192, and 11,037,756, each and all of which are incorporated herein by reference.

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC section 112 unless the exact words "means for" are followed by a participle.

The claims as filed are intended to be as comprehensive as possible, and NO subject matter is intentionally relinquished, dedicated, or abandoned.

What is claimed is:

1. A method of operating a charged particle beam tool including a charged particle beam column configured to generate a charged particle beam, comprising:

a) capturing an under-focused image of a calibration target using the charged particle beam;

b) capturing an over-focused image of the calibration target using the charged particle beam;

c) determining an offset vector in response to the under-focused image and the over-focused image;

d) in response to a magnitude of the offset vector being greater than a threshold, adjusting a charge distribution of one or more alignment electrodes of the charged particle beam column in response to the offset vector and a previous charge distribution of the alignment electrodes, so that the charged particle beam has an adjusted alignment;

e) in response to the magnitude of the offset vector being greater than the threshold, repeating steps a) through e);

f) in response to the magnitude of the offset vector being less than the threshold, processing the substrate using the charged particle beam column with the adjusted alignment.

2. The method of claim 1, wherein step d) includes estimating a charge distribution, in response to the offset vector, to reduce a disalignment of the charged particle beam from an optical axis of the charged particle beam column; and wherein the adjusting adjusts the charge distribution of the alignment electrodes to the estimated charge distribution.

3. The method of claim 1, wherein the threshold is selected so that if the magnitude of the offset vector is less than the threshold, then the charged particle beam is aligned to an optical axis of the charged particle beam column to within a selected tolerance.

4. The method of claim 1, wherein the determining is performed using a windowed comparison between pixels of the under-focused image and pixels of the over-focused image, so that a window corresponding to a greatest similarity between the windowed portions of the under-focused image and the over-focused image indicates the offset vector.

5. The method of claim 1, wherein the adjusting a charge distribution adjusts the charge distribution in response to an updated force vector to be applied to the charged particle beam;

wherein the updated force vector is selected in response to a previous force vector applied to the charged particle beam by a previous charge distribution of the alignment electrodes, and in response to a gradient of the offset vector.

6. The method of claim 5, wherein the updated force vector is selected in response to a scalar factor; and wherein the scalar factor is selected to be larger for relatively larger magnitudes of the gradient of the offset vector, and smaller for relatively smaller magnitudes of the gradient of the offset vector.

7. The method of claim 1, wherein a resolution of the charged particle beam is selected to be relatively lower in an initial iteration of steps a) through e), and the resolution of the charged particle beam is selected to be relatively higher in response to the magnitude of the offset vector decreasing in subsequent iterations of steps a) through e).

8. The method of claim 1, wherein the threshold is selected in response to a noise floor of the charged particle beam tool, or in response to a minimum measurable change in the magnitude of the offset vector.

9. The method of claim 1, wherein the calibration target is on the surface of a workpiece fixedly attached to a clamp, and the clamp is fixedly attached to a workpiece positioning system configured to move the workpiece relative to the charged particle beam column.

10. The method of claim 1, further including:

wherein the offset vector is a first offset vector;

g) prior to step a), capturing a first focused image of the calibration target using the charged particle beam; and h) after step d), in response to the magnitude of the offset vector being greater than the threshold, capturing a second focused image of the calibration target using the charged particle beam, determining a second offset vector in response to the first focused image and the second focused image, and moving the stage in response to the second offset vector;

wherein step e) includes repeating steps g) and h) in response to the magnitude of the first offset vector being greater than the threshold.

11. The method of claim 10, wherein the moving moves the stage to center the calibration target in a main-field deflection area of the charged particle beam column.

12. A method of operating a charged particle beam tool including a charged particle beam column configured to generate a charged particle beam, comprising:

a) capturing a first focused image of a calibration target using the charged particle beam;

b) capturing an under-focused image of the calibration target using the charged particle beam;

c) capturing an over-focused image of the calibration target using the charged particle beam;

d) determining a first offset vector in response to the under-focused image and the over-focused image;

e) in response to a magnitude of the first offset vector being greater than a threshold, adjusting a charge distribution of one or more alignment electrodes of the charged particle beam column in response to the first offset vector and a previous charge distribution of the alignment electrodes, so that the charged particle beam has an adjusted alignment;

f) in response to the magnitude of the first offset vector being greater than the threshold, capturing a second focused image of the calibration target using the charged particle beam with the adjusted alignment, determining a second offset vector in response to the first focused image and the second focused image, and moving the stage in response to the second offset vector;

g) in response to the magnitude of the first offset vector being greater than the threshold, repeating steps b) through g);

h) in response to the magnitude of the offset vector being less than the threshold, processing the substrate using the charged particle beam column with the adjusted alignment.

13. The method of claim 12, wherein step e) includes estimating a charge distribution, in response to the first offset vector, to reduce a disalignment of the charged particle beam from an optical axis of the charged particle beam column; and wherein the adjusting adjusts the charge distribution of the alignment electrodes to the estimated charge distribution.

14. The method of claim 12, wherein the moving moves the stage to center the calibration target in a main-field deflection area of the charged particle beam column.

15. The method of claim 12, wherein the threshold is selected so that if the magnitude of the first offset vector is less than the threshold, then the charged particle beam is aligned to an optical axis of the charged particle beam column to within a selected tolerance.

16. The method of claim 12, wherein the step d) determining is performed using a windowed comparison between pixels of the under-focused image and pixels of the over-focused image, so that a window corresponding to a greatest similarity between windowed portions of the under-focused image and the over-focused image indicates the first offset vector.

17. The method of claim 12, wherein the adjusting a charge distribution adjusts the charge distribution in response to an updated force vector to be applied to the charged particle beam;

wherein the updated force vector is selected in response to a previous force vector applied to the charged particle beam by a previous charge distribution of the alignment electrodes, and in response to a gradient of the first offset vector.

18. The method of claim 17, wherein the updated force vector is selected in response to a scalar factor; and wherein the scalar factor is selected to be larger for relatively larger magnitudes of the gradient of the offset vector, and smaller for relatively smaller magnitudes of the gradient of the offset vector.

19. The method of claim 12, wherein a resolution of the charged particle beam is selected to be relatively lower in an initial iteration of steps a) through e), and the resolution of the charged particle beam is selected to be relatively higher in response to the magnitude of the offset vector decreasing in subsequent iterations of steps a) through e).

20. The method of claim 12, wherein the threshold is selected in response to a noise floor of the charged particle beam tool, or in response to a minimum measurable change in the magnitude of the first offset vector.

21. The method of claim 12, wherein the calibration target is on the surface of a workpiece fixedly attached to a clamp, the clamp fixedly attached to a workpiece positioning system configured to move the workpiece relative to the charged particle beam column.

* * * * *